(12) United States Patent
Tamura et al.

(10) Patent No.: US 8,008,211 B2
(45) Date of Patent: Aug. 30, 2011

(54) PATTERN FORMING METHOD, SEMICONDUCTOR DEVICE MANUFACTURING APPARATUS AND STORAGE MEDIUM

(75) Inventors: Akitake Tamura, Nirasaki (JP); Teruyuki Hayashi, Sendai (JP); Kaoru Fujihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 380 days.

(21) Appl. No.: 12/343,968

(22) Filed: Dec. 24, 2008

(65) Prior Publication Data

US 2009/0176374 A1  Jul. 9, 2009

Related U.S. Application Data

(60) Provisional application No. 61/034,515, filed on Mar. 7, 2008.

(30) Foreign Application Priority Data

Dec. 28, 2007  (JP) ................................. 2007-339922

(51) Int. Cl.
*H01L 21/461* (2006.01)

(52) U.S. Cl. ........ 438/717; 438/689; 438/725; 438/736; 257/E21.026; 257/E21.027

(58) Field of Classification Search .................. 438/717, 438/725, 736, 689; 257/E21.026, E21.027
See application file for complete search history.

(56) References Cited

U.S. PATENT DOCUMENTS

| 5,357,131 | A * | 10/1994 | Sunami et al. ................ 257/301 |
| 7,572,572 | B2 * | 8/2009 | Wells ............................. 430/311 |
| 2008/0014533 | A1 * | 1/2008 | Keller et al. ................... 430/311 |

FOREIGN PATENT DOCUMENTS

JP  2006-261307  9/2006

* cited by examiner

*Primary Examiner* — Thanh Nguyen
(74) *Attorney, Agent, or Firm* — Oblon, Spivak, McClelland, Maier & Neustadt, L.L.P.

(57) ABSTRACT

A pattern forming method includes (a) forming pairs of deposits on sidewalls of mask portions in first mask patterns by forming a thin film thereon, etching it to leave deposits, and exposing a top surface of a second-layer film between the deposits; (b) forming second mask patterns formed of mask portions corresponding to the deposits by removing the mask portion, plasma etching the second-layer film, and removing the deposits; (c) forming a thin film thereon, and etching it to leave deposits on sidewalls of mask portions facing each other and to expose a third-layer film between the deposits while leaving deposits between adjacent mask portions; and (d) forming grooves thereon by removing the second mask portion, and etching off the third-layer film.

9 Claims, 19 Drawing Sheets

PATTERN FORMING METHOD, SEMICONDUCTOR DEVICE MANUFACTURING APPARATUS AND STORAGE MEDIUM

FIELD OF THE INVENTION

The present invention relates to a pattern forming method, a semiconductor device manufacturing apparatus, and a storage medium storing a computer program for implementing the method.

BACKGROUND OF THE INVENTION

Generally, in a semiconductor device manufacturing process, a multi-layer fine wiring structure is formed by using a photolithography technique on a semiconductor wafer (hereinafter, referred to as a "wafer") as a substrate to be processed. The photolithography technique involves the steps of laminating a mask having an opening on an upper layer of an etching target film, e.g., an insulating layer or the like; etching the etching target film via the opening; and patterning a wiring structure by removing the mask.

The mask is formed by coating a photoresist film formed of a photosensitive resin composition on, e.g., a wafer surface, and patterning an opening corresponding to the wring structure in the photoresist film by performing an exposure process and a development process. Therefore, the fineness of the wiring structure is affected by resolution of an exposure device used in the exposure process, and an exposure line width becomes substantially the same as a wiring line width.

FIGS. 13A and 13B show a circuit structure of a NAND type flash memory as an example of a semiconductor device. FIG. 13A is a top view of the circuit structure, and FIG. 13B is a cross sectional view taken along arrow A-A of FIG. 13A. A reference numeral 11 in the drawings indicates a multi-layer structure formed on a surface of a substrate 10, and is referred to as a word line. As shown in FIG. 13B, the word line 11 is formed by laminating e.g., a silicon oxide film 15, a polysilicon film 16, an ONO film 17 and a polysilicon film 18 in that order from the bottom.

Further, a plurality of conductive silicon films 12 are formed on the surface of the substrate 10 so as to cross the word lines 11. The silicon films 12 are arranged to be perpendicular to the word lines 11, thus forming a plurality of parallel lines 12A referred to as active lines which electric current can flow through. Furthermore, crossing parts 19 of the word lines 11 and the silicon films 12, which are surrounded by dotted lines in FIG. 13A, serve as transistors. Charges are accumulated in the ONO films 17 at the crossing parts 19.

When a width L2 of a groove 11A between the word lines 11 is excessively larger than a width L1 of the word line 11, the charges may not be accumulated in the ONO film 17. On the other hand, when L1 is excessively larger than L2, parasitic capacitances between the adjacent polysilicon films (15 and 15, and 17 and 17) in the word lines 11 are increased. Accordingly, the charges may be accumulated between the films, or the electricity may flow between the films (15 and 15, and 17 and 17), which inhibits the function of the device. Therefore, the ratio between L1 and L2 needs to be about 1:1. In order to ensure the function of the device, a width L3 of the line 12A of the silicon film 12 and a gap L4 between the adjacent lines 12A have substantially the same dimensions as those of L1 and L2.

Considering that the dimensions of L1 to L4 need to be substantially the same, a high integration of the crossing parts 19 serving as transistors and the resultant increase in the storage amount can be achieved in the NAND type flash memory more effectively accordingly as L1 to L4 are reduced in size, and the word lines 11 and the active lines 12a are formed more densely. In order to form such a fine wiring as above, it is required to form a pattern of a thin line width densely on an etching target film lying below a photoresist film.

From the above viewpoint, exposure devices capable of performing exposure process for a finer line width has been adopted. In the past, there is used an exposure device for performing an exposure process for a line width of about 130 nm by using a KrF excimer laser. Recently, instead of this, one for performing an exposure process for a line width of about 70 nm by using an ArF excimer laser has been used. In addition, there is being developed a technique for performing an exposure process for a line width of about 40 to 50 nm by using a liquid immersion lithography in which an exposure is carried out via a liquid film formed on a wafer surface by using an ArF excimer. However, in general, an exposure device is high-priced, and the cost increases when changing exposure devices according to a required wiring line width.

Due to growing demands for a further reduction in wiring size, it is required to perform an exposure process for a line width of about 20 to 30 nm. As a higher resolution than can be achieved by the exposure device becomes required, an etching method referred to as a double patterning is being researched. In this double patterning method, an inorganic film of, e.g., SiN or the like is formed as a pattern mask below a photoresist mask by using the photoresist mask. Next, sidewalls are formed at both sides of wall portions of the pattern mask. Thereafter, an underlying layer of the pattern mask is etched using the sidewall as a mask, thus forming a single pattern or double patterns corresponding to a pattern of the pattern mask on the underlying layer. In accordance with this method, it is possible to form on the underlying layer a pattern whose line width is substantially half as large as that of the pattern of the pattern mask with a substantially doubled density.

However, the line width of the photoresist pattern that can be formed by the exposure device is limited. Further, since the ratio between the line width of a mask portion and that of a patterned portion is usually about 1:1 in the photoresist, the ratio between the line width of a mask portion and that of a patterned portion is also about 1:1 in the SiN film serving as the pattern mask below the photoresist film. Therefore, as shown in FIG. 14A, a trimming process is performed to adjust the width of a patterned portion 10B by etching after the patterned portion 10B is formed in a SiN film 10A, so that the ratio between the width of the pattern portion ultimately formed in an etching target film and the gap between adjacent patterned portions becomes about 1:1.

When, however, the trimming is carried out, it is difficult to vertically control the shape of sidewalls of the patterned portion 10B, and therefore a shoulder cut shape is formed at the wall portions forming the patterned portion 10B so that upper parts of the wall portions become thinner as illustrated in FIG. 14B. Thus, sidewalls 10C are formed after the shape of the wall portions as shown in FIG. 14C. Since the sidewalls 10C are formed as such, the underlying layer of the SiN film 10A is etched into an undesired shape. This may lead to a failure in forming the desired pattern in the etching target film.

Further, although the double patterning method is used, it is difficult to form on an etching target film a pattern whose line width is less than about 30 nm in case of exposing the photoresist by an exposure device using an ArF excimer laser. Furthermore, even when the photoresist is exposed by the liquid immersion lithography with the exposure device using an ArF excimer laser, it is practically impossible to form on an etching target film a pattern whose line width is less than about 20 nm. Therefore, as demands for further reduction in wiring size are increased, it is impossible to satisfy the demands by forming a wiring of, e.g., 10 nm.

Japanese Patent Application Publication No. 2006-261307 discloses a method for manufacturing a semiconductor device using the double patterning technique. However, according to this method, the above-described problems cannot be solved, and a CMP process or the like is needed in addition to an etching process, thus increasing the processing time.

Further, there is known a method in which a pattern is formed in a sacrificial film below a photoresist film by being patterned after that of the photoresist film, and then the photoresist film removed, and then a new photoresist film is formed to be so arranged not to be overlapped with the previously formed pattern, and then a pattern is formed in the sacrificial film according to the new pattern, and finally a dense pattern is formed in an etching target film below the sacrificial film. However, the above method also has a drawback in that it is difficult to align the substrate for forming the pattern as above.

SUMMARY OF THE INVENTION

In view of the above, the present invention provides a pattern forming method for forming a parallel linear pattern in a film on a substrate by plasma etching, capable of ensuring reduction in the pattern size; a semiconductor device manufacturing apparatus therefor; and a storage medium therefor.

In accordance with one aspect of the present invention, there is provided a pattern forming method for forming parallel linear grooves on a substrate by plasma etching, wherein the substrate has thereon three-layer films including from the top a first-layer film, a second-layer film and a third-layer film by using a substrate in which first mask patterns of linear shape are formed on the first-layer film.

The method includes: (a) forming pairs of deposits on both sidewalls of each of mask portions in the first mask patterns by forming a thin film on the first mask patterns, performing an anisotropic etching by plasma to leave downwardly widening deposits at the both sidewalls of each of the mask portions, and exposing a top surface of the second-layer film between the deposits; (b) forming on the second-layer film second mask patterns each formed of a pair of mask portions corresponding to the pair of the deposits by removing the mask portion, plasma etching the second-layer film by using the deposits as a mask, and removing the deposits; and thereafter, (c) forming a thin film on the second mask patterns of the second-layer film, and performing an anisotropic etching by plasma to leave downwardly widening deposits on sidewalls of every two of mask portions facing each other via a region corresponding to a width-directional center of one of the mask portions of the first mask patterns, and to expose a top surface of the third-layer film between the deposits while leaving deposits between adjacent mask portions of two of the second mask patterns; and thereafter, (d) forming grooves on the third-layer film by removing the second mask portion formed on the second-layer film, and etching off the third-layer film by plasma while using the deposits as a mask.

Herein, a ratio between a width of each of the grooves formed on the third-layer film and that between two adjacent ones of the grooves is about 1:1. Further, in the first mask patterns formed on the first-layer film, a ratio between a width of each of the grooves and that of a mask portion between two adjacent ones of the grooves is about 1:1.

In accordance with another aspect of the present invention, there is provided a pattern forming method for forming parallel linear grooves on a substrate by plasma etching, wherein the substrate has thereon three-layer films including from the top a first-layer film, a second-layer film, a third-layer film and a fourth-layer film by using a substrate in which first mask patterns of linear shape are formed on the first-layer film.

The method includes: (a) forming pairs of deposits on both sidewalls of each of mask portions in the first mask patterns by forming a thin film on the first mask patterns, performing an anisotropic etching by plasma to leave downwardly widening deposits at the both sidewalls of each of the mask portions, and exposing a top surface of the second-layer film between the deposits; (b) forming on the second-layer film second mask patterns each formed of a pair of mask portions corresponding to the pair of the deposits by removing the mask portion, plasma etching the second-layer film by using the deposits as a mask, and removing the deposits; and thereafter, (c) forming on the third-layer film third mask patterns each formed of a pair of mask portions corresponding to the pair of downwardly widening deposits formed both sidewalls of the mask portions of the second mask patterns by sequentially performing processes equivalent to the steps (a) and (b) using the second mask patterns of the second-layer film; and thereafter, (d) forming a thin film on the third mask patterns of the third-layer film, and performing an anisotropic etching by plasma to leave downwardly widening deposits on sidewalls of every two of mask portions facing each other via a region corresponding to a width-directional center of one of the mask portions of the first mask patterns, and to expose a top surface of the fourth-layer film between the deposits while leaving deposits between adjacent mask portions of two of the second mask patterns; and thereafter, (e) forming grooves on the fourth-layer film by removing the third mask portion formed on the third-layer film, and etching off the fourth-layer film by plasma while using the deposits as a mask.

Herein, a ratio between a width of each of the grooves formed on the fourth-layer film and that between two adjacent ones of the grooves is about 1:1. Further, in the first mask patterns formed on the first-layer film, a ratio between a width of each of the grooves and that of a mask portion between two adjacent ones of the grooves is about 1:1.

In accordance with still another aspect of the present invention, there is provided a pattern forming method for forming parallel linear grooves on a substrate by plasma etching, wherein the substrate has thereon nth-layer films (n being an integer greater than 4) including from the top a first-layer film to a nth-layer film by using a substrate in which first mask patterns of linear shape are formed on the first-layer film.

The method includes: (a) forming pairs of deposits on both sidewalls of each of mask portions in the first mask patterns by forming a thin film on the first mask patterns, performing an anisotropic etching by plasma to leave downwardly widening deposits at the both sidewalls of each of the mask portions, and exposing a top surface of the second-layer film between the deposits; (b) forming on the second-layer film second mask patterns each formed of a pair of mask portions corresponding to the pair of the deposits by removing the mask portion, plasma etching the second-layer film by using the deposits as a mask, and removing the deposits; and thereafter, (c) forming on the third-layer film third mask patterns each formed of a pair of mask portions corresponding to the pair of downwardly widening deposits formed both sidewalls of the mask portions of the second mask patterns by sequentially performing processes equivalent to the steps (a) and (b)

using the second mask patterns of the second-layer film; (d) forming on the (n−1)th-layer film (n−1)th mask patterns each formed of a pair of mask portions corresponding to the pair of downwardly widening deposits formed both sidewalls of the mask portions of (n−2)th mask patterns by performing a process equivalent to the step (c) with respect to the third-layer film to the (n−1)th-layer film; and thereafter, (e) forming a thin film on the (n−1)th mask patterns of the third-layer film, and performing an anisotropic etching by plasma to leave downwardly widening deposits on sidewalls of every two of mask portions facing each other via a region corresponding to a width-directional center of one of the mask portions of the first mask patterns, and to expose a top surface of the nth-layer film between the deposits while leaving deposits between adjacent mask portions of two of the second mask patterns; and thereafter, (f) forming grooves on the n-layer film by removing the (n−1)th mask portion formed on the (n−1)th-layer film, and etching off the nth-layer film by plasma while using the deposits as a mask.

Herein, a ratio between a width of each of the grooves formed on the nth-layer film and that between two adjacent ones of the grooves is about 1:1. Further, in the first mask patterns formed on the first-layer film, a ratio between a width of each of the grooves and that of a mask portion between two adjacent ones of the grooves is about 1:1.

In accordance with still another aspect of the present invention, there is provided a semiconductor manufacturing apparatus including a loader module where a carrier accommodating a substrate is mounted, for loading and unloading the substrate in the carrier; a transfer chamber of a vacuum atmosphere to which the substrate is loaded via the loader module; a film forming module configured to perform a film forming process on the substrate loaded via the transfer chamber; an etching module configured to perform an etching process on the substrate loaded via the transfer chamber; a substrate transfer unit configured to transfer the substrate among the transfer chamber, the loader module, the film forming module and the etching module; and a control unit for controlling an operation of the substrate transfer unit so as to perform the pattern forming method of the above.

In accordance with still another aspect of the present invention, there is provided a storage medium storing therein a computer program running on a computer used for a semiconductor manufacturing apparatus configured to process a substrate, wherein the computer program, when executed, performs the step group of performing the pattern forming method of the above.

In accordance with the present invention, when a groove is formed on an underlying layer while using the linear mask patterns formed on the first-layer film as an uppermost layer of the substrate on which the films are to be laminated, sidewalls (downwardly widening deposits) are formed at portions where mask portions formed of specified films are arranged. At this time, there exist a portion where an underlying layer is exposed between the deposits and a portion filling the gap between the mask portions where the deposits are seamlessly formed.

By etching the underlying layer while using the deposits as a mask, small-sized patterns of the first-layer film can be formed on the underlying layer. Further, by adjusting dimensions of each of the laminated films, the width of the groove forming the pattern obtained by etching the laminated films can be made substantially equal to the gap between adjacent grooves. Moreover, a trimming process for reducing the line width of the mask portion in the mask pattern of each film is not required. Accordingly, the process can be simplified, and the etching can be prevented from being adversely affected by misshaping of the mask portion that might be caused by the trimming process. In other words, it is especially effective in manufacturing a semiconductor device such as a NAND type flash memory, in which parallel wirings having a uniform width need to be formed with gaps whose width is substantially same as that of the wirings.

BRIEF DESCRIPTION OF THE DRAWINGS

The above features of the present invention will become apparent from the following description of embodiments, given in conjunction with the accompanying drawings, in which.

DETAILED DESCRIPTION OF THE EMBODIMENT

First Embodiment

Figure 1A:
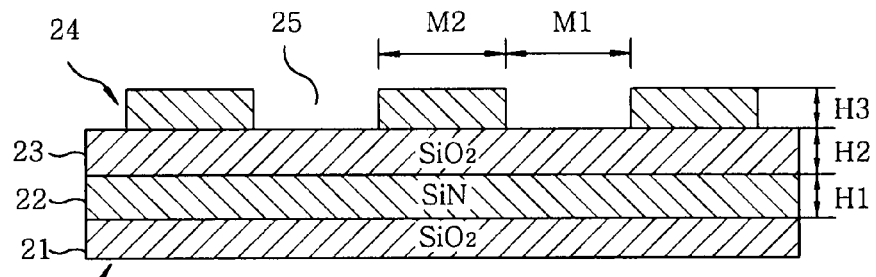
FIGS. 1A to 1D show a process for manufacturing a semiconductor device in accordance with a first embodiment of the present invention.

Referring to FIG. 1A, there will be given an explanation of a wafer W, which is a silicon substrate to which a first embodiment of a semiconductor device manufacturing method of the present invention is applied. On the surface of the wafer W, an SiN film 24 serving as a hard mask, an $SiO_2$ (silicon oxide) film 23, an SiN film (silicon nitride film) 22 and an $SiO_2$ film 21 are formed in that order from the top. Mask patterns 25 are formed in the SiN film 24 by photolithography using a photoresist described in the background of the invention. Although FIG. 1 shows only a cross section thereof, each mask pattern 25 actually extends along a line oriented in a front-and-rear direction of a ground plane, and the $SiO_2$ film 23 is exposed at the bottom portion of each mask pattern 25.

In the illustrated example, the mask patterns 25 are formed to have regular intervals. A width M1 of each mask pattern 25 and a width M2 between adjacent mask patterns 25 are, e.g., 80 nm, and the ratio between M1 and M2 is 1:1. Further, the thicknesses of the SiN film 22, the $SiO_2$ film 23 and the SiN film 24, which are denoted by H1, H2 and H3, respectively, are, e.g., 27, 27 and 55 nm, respectively.

In the first embodiment, by setting the dimensions of the mask pattern 25 and the films 22 to 24 as described above, secondary patterns corresponding to the mask patterns 25 are formed in the SiN film 22 (which serves as an etching target film) such that the width of each secondary pattern is about ⅓ of that of each mask pattern 25, and the ratio of the line width of each secondary pattern with respect to the gap between adjacent ones of the secondary patterns is 1:1.

Therefore, the number of patterns formed in the SiN film 22 is three times the number of the mask patterns 25 (tripling the number of patterns). Although the ratio between M1 and M2 of the mask pattern 25 and the ratio of the width of each secondary pattern in the SiN film 22 with respect to the gap between the adjacent secondary patterns are designed to be 1:1, it is preferred that the ratio be set to be close to 1:1 in consideration of a manufacturing error that might otherwise affect the manufacture of the device. The above-mentioned ratio close to 1:1 is a ratio within a range from, for example, 1:0.95 to 1:1.05.

Figure 1B:
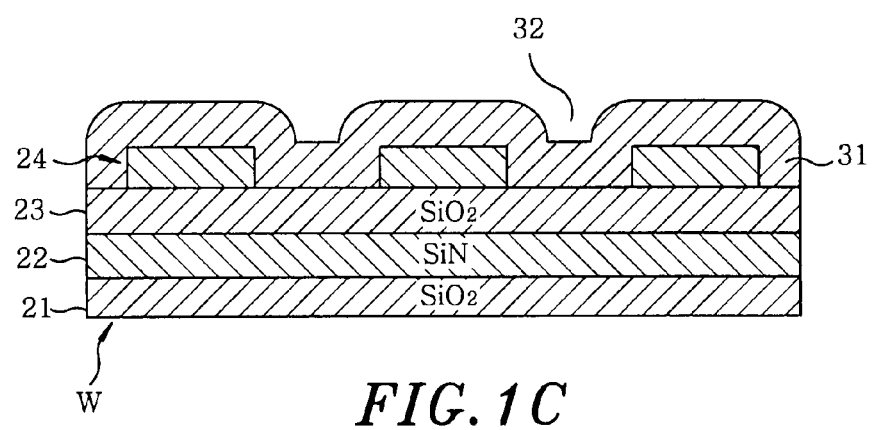

First, a film forming process by thermal CVD is performed by supplying a processing gas, e.g., an $SiH_4$ gas, onto a wafer W and heating the wafer W. Next, an amorphous silicon film 31 is formed, with such a thickness as to form a recess 32, over the entire surface of the wafer W including the side surfaces of the mask patterns 25. Then, the film forming process is suspended (FIG. 1B).

Figure 1C:
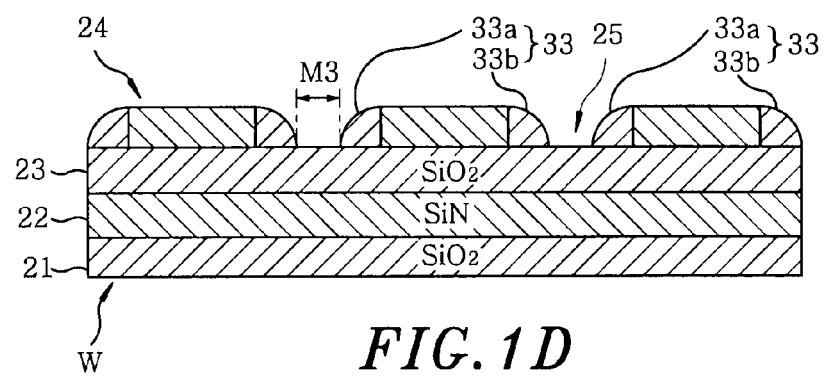

Next, processing gases such as an $O_2$ gas and a HBr gas are supplied onto the wafer W. By turning the processing gases into a plasma, the amorphous silicon film 31 is etched anisotropically. The etching is stopped when the following conditions are met: (1) downwardly widening deposits (sidewalls) 33a and 33b forming a pair 33 etched from the amorphous silicon film 31 remain at the sidewalls of the mask portion in the SiN film 24; (2) the top surface of the SiN film 24 is exposed between deposits 33a and 33b that form a pair 33; and (3) the top surface of the $SiO_2$ film 23 is exposed between two adjacent pairs 33 (FIG. 1C). By performing the anisotropic etching process uniformly on the amorphous silicon film 31, the inclination of the sidewalls of the deposits 33a and 33b becomes approximately same as that of the sidewalls of the recess 32. Further, an opening width M3 between two adjacent pairs 33 of deposits is, e.g., 27 nm.

Figure 1D:
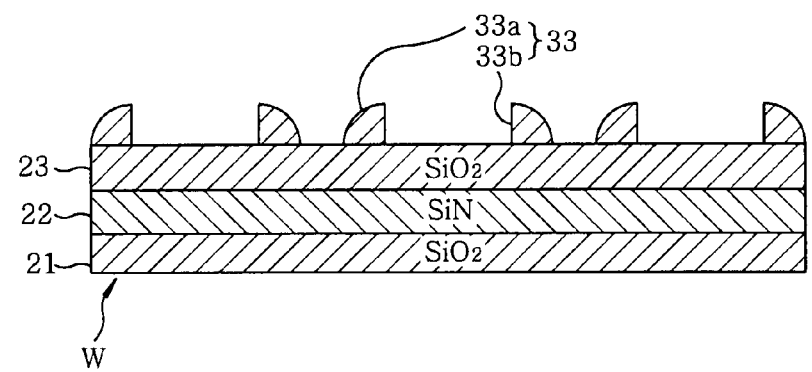

After completing the etching of the amorphous silicon, processing gases such as $CF_4$, $CHF_3$, Ar, $O_2$, $CH_2F_2$ and $F_2$ gases are supplied onto the wafer W. The SiN film 24 is etched off by a plasma generated from these processing gases. Accordingly, the $SiO_2$ film 23 becomes exposed between deposits 33a and 33b forming a pair 33 (FIG. 1D).

Figure 2A:
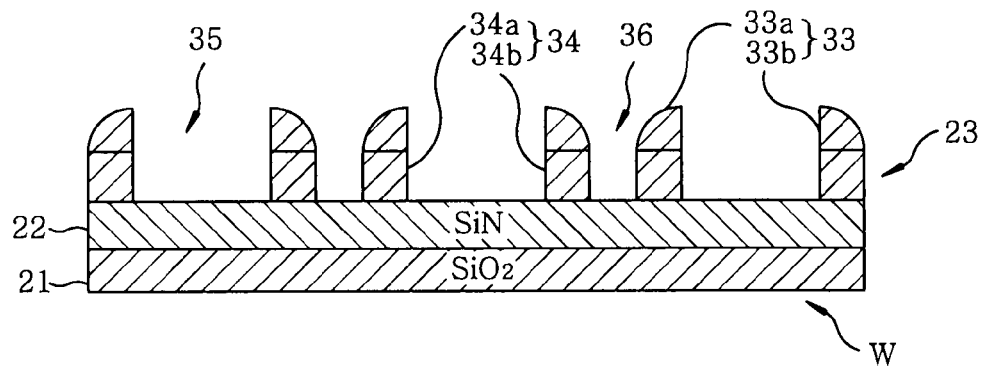
FIGS. 2A to 2E further show the process for manufacturing the semiconductor device in accordance with the first embodiment of the present invention.

Thereafter, processing gases such as an Ar gas and a $C_4F_8$ gas are supplied onto the wafer W. By turning the processing gases into a plasma, the $SiO_2$ film 23 is anisotropically etched down while masked by the deposits 33a and 33b. The etching is stopped when the SiN film 22 is exposed at the bottoms of mask patterns 35 and 36, wherein the mask pattern 35 is formed between mask portions 34a and 34b forming a pair 34 corresponding to the deposits 33a and 33b, and the mask pattern 36 is formed in between a pair 34 (FIG. 2A). The mask portions 34a and 34b forming a pair 34 are so arranged to face each other via a region located at the widthwise center of the mask portion in the SiN film 24.

Figure 2B:
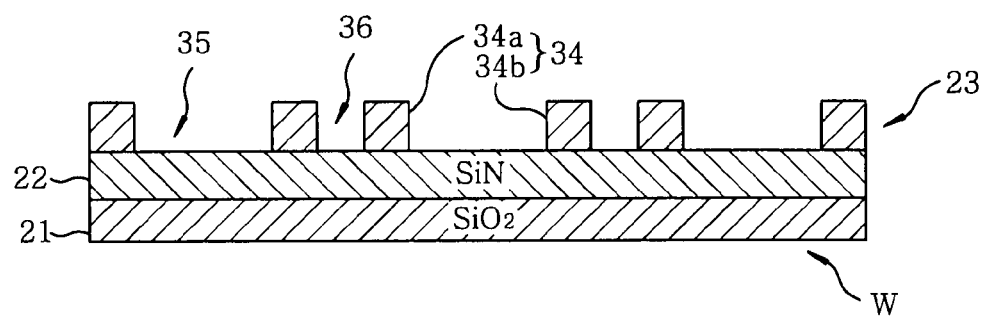

Next, processing gases such as an $O_2$ gas and a HBr gas are supplied onto the wafer W, and the deposits 33a and 33b formed of the amorphous silicon film 31 are etched off by a plasma generated from these processing gases (FIG. 2B).

Figure 2C:
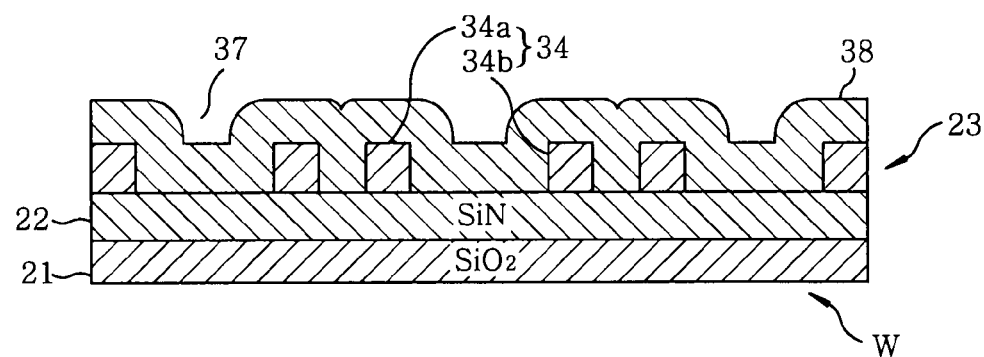

Thereafter, a film forming process by thermal CVD is performed by supplying processing gas such as a $SiH_4$ gas onto the wafer W and heating the wafer W. Then, an amorphous silicon film 38 is formed with such a thickness as to form a recess 37 corresponding to the mask pattern 35, and is coated on the top surface of the SiN film 22, the top surface of the $SiO_2$ film 23 and the side surfaces of the mask patterns 35 and 36 (FIG. 2C).

Figure 2D:
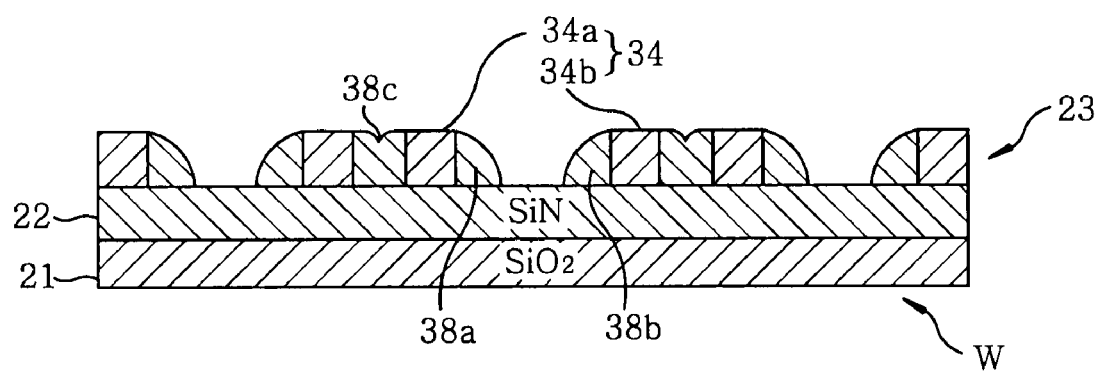

Upon completion of the film forming process, processing gases such as an $O_2$ gas and a HBr gas are supplied onto the wafer W. Then, the amorphous silicon film 38 is anisotropically etched down by a plasma generated from these processes gases. The etching is stopped when the following conditions are met: (1) the top surface of the $SiO_2$ film 23 is exposed; (2) downwardly widening deposits (sidewalls) 38a and 38b are remaining at inner sidewalls of the mask portions 34a and 34b forming a pair 34; and (3) the SiN film 24 is exposed between the deposits 38a and 38b (FIG. 2D).

Figure 2E:
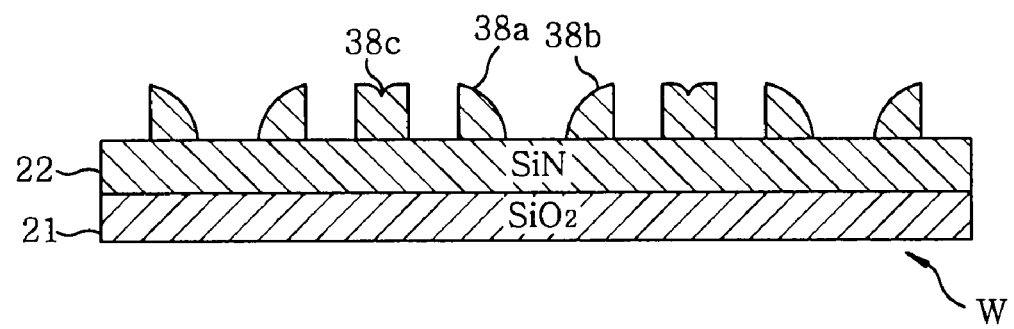

After the etching is stopped, processing gases such as an Ar gas and a $C_4F_8$ gas are supplied onto the wafer W. The $SiO_2$ film 23 is etched off by a plasma generated from these processing gases. When the SiN film 22 is exposed between the deposits 38a and 38c and between the deposits 38b and 38c (FIG. 2E), the etching is stopped.

Figure 3A:
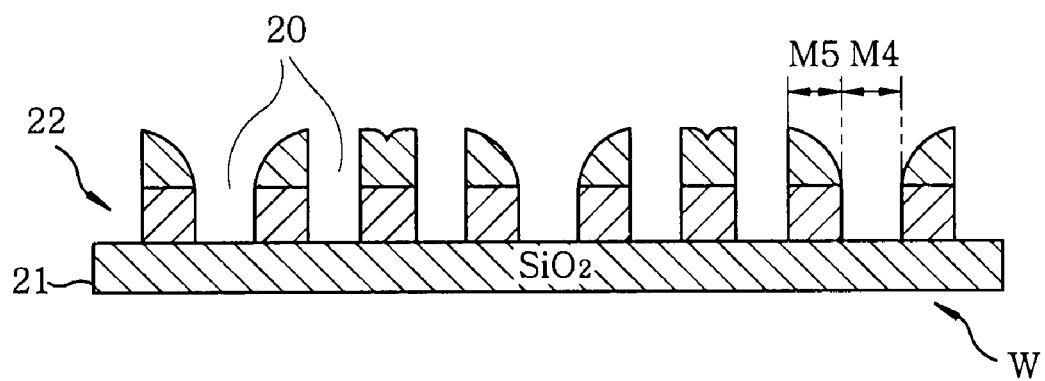
FIGS. 3A and 3B further show the process for manufacturing the semiconductor device in accordance with the first embodiment of the present invention.

Next, processing gases such as $CF_4$, $CHF_3$, Ar, $O_2$, $CH_2F_2$ and $F_2$ gases are supplied onto the wafer W. The SiN film 22 is anisotropically etched down by a plasma generated from these processing gases while masked by the deposits 38a to 38c of the amorphous silicon film 38. As a consequence, patterns 20 are formed in the SiN film 22. When the $SiO_2$ film 21 is exposed at the bottoms of the patterns 20 (FIG. 3A), the etching is stopped. As described above, a width M4 of each pattern 20 and a width M5 of adjacent patterns 20 are both 27 nm, for example, which is about ⅓ of the width M1 of the mask patterns 25 of the SiN film 24.

Figure 3B:
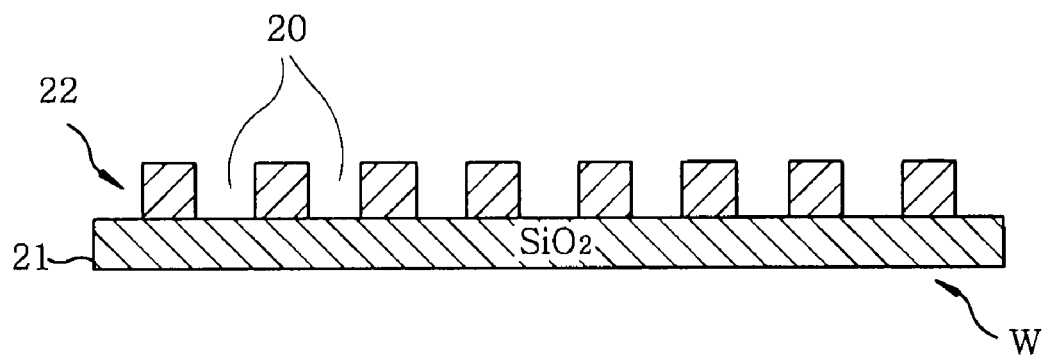

After the patterns 20 are formed, processing gases such as an $O_2$ gas and a HBr gas are supplied onto the wafer W. Then, the deposits 38a to 38c are etched off by a plasma generated from theses gases (FIG. 3B).

In accordance with the first embodiment, the process is started from the downwardly widening deposits (sidewalls) 33a and 33b of the amorphous silicon film 31 formed at the mask portions of the SiN film 24. Next, the deposits 38a and 38b of the amorphous silicon film 38, which have intervals therebetween, are formed between the mask portions 34a and 34b forming a pair 34 having a large gap therebetween on the SiN film 22. Further, a deposit 38c is formed between a mask portion 34a in a pair 34 and a mask portion 34b in an adjacent pair 34 to fill the gap between these mask portions, and the SiN film 22 is etched.

By performing the etching as above, the number of the patterns 20 is three times the number of the patterns 25 formed on the SiN film 24, wherein the line width of each pattern 20 is ⅓ as large as that of each pattern 25. Thus, by using the patterns 20 reduced in size, the semiconductor device having a fine wiring can be manufactured. Namely, a fine pattern can be formed by using an economical exposure device such as one using a KrF excimer laser whose exposure line width is relatively large.

Further, in the first embodiment, the dimensions of the films formed on or above the SiO₂ film 21 are so adjusted that the width of each pattern (grooves) 20 formed in the SiN film 22 is approximately equal to the gap between adjacent patterns 20. Further, it is not necessary to perform the trimming for reducing the line width of the mask portion of the SiN film 24. Therefore, the process is simplified, and the etching can be achieved without being affected by misshaping of the mask portion that might be caused by the trimming. Therefore, it is especially effective in manufacturing a semiconductor device such as a NAND type flash memory, in which parallel wirings having a uniform width need to be formed with gaps whose width is substantially same as that of the wirings.

Second Embodiment

Figure 4A:
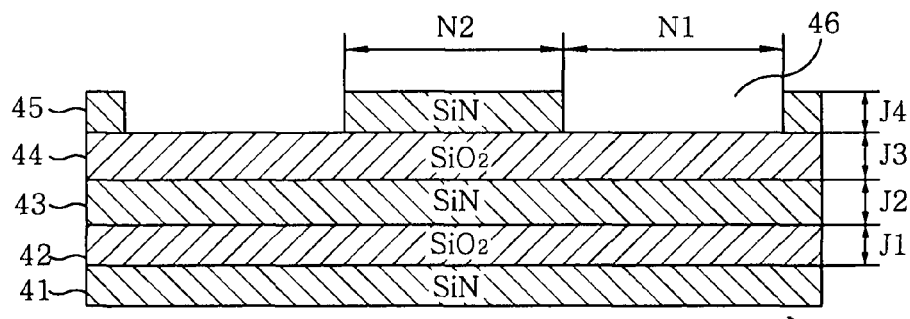
FIGS. 4A to 4D show a process for manufacturing a semiconductor device in accordance with a second embodiment of the present invention.

Hereinafter, the second embodiment of the present invention will be described. In the second embodiment, an SiN film 45, an SiO₂ film 44, an SiN film 43, an SiO₂ film 42 and an SiN film 41 are formed over the entire surface of a wafer W in that order from the top (see FIG. 4A). Mask patterns 46 equivalent to the mask patterns 25 in the SiN film 24 are formed in the SiN film 45.

In the illustrated example, the mask patterns 46 are formed at regular intervals. A width N1 of each mask pattern 46 and a width N2 between adjacent mask patterns 46 are, e.g., 80 nm. The ratio between N1 and N2 is 1:1. Further, the thicknesses of the SiO₂ film 42, the SiN film 43, the SiO₂ film 44 and the SiN film 45 which are denoted by J1, J2, J3 and J4, respectively, are, e.g., 16 nm, 16 nm, 16 nm and 16 nm, respectively.

In the second embodiment, the dimensions of the mask patterns 46 and the films 42 to 45 are set as above, and the formation of sidewalls and the plasma etching by using the sidewalls as the mask are repetitively performed as in the first embodiment. Thus, a plurality of patterns are formed in the SiO₂ film 42 corresponding to the mask patterns 46. The width of each pattern in the SiO₂ film 42 is about ⅕ of that of each mask pattern 46, and the ratio between the width of the pattern in the SiO₂ film 42 and the gap between adjacent ones of the patterns in the SiO₂ film 42 is 1:1. Thus, the number of patterns formed in the SiO₂ film 42 is five times the number of the patterns formed in the SiN film 45 (quintupling the number of patterns). The processing gases used for plasma etching the films and those used for forming the amorphous silicon film are the same as those used in the first embodiment.

Figure 4B:
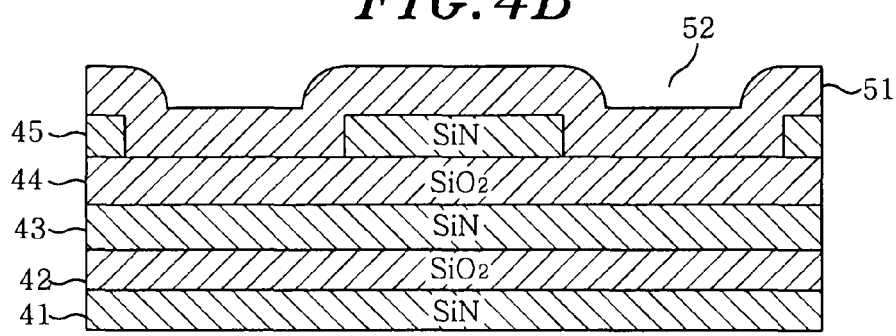
Figure 4C:
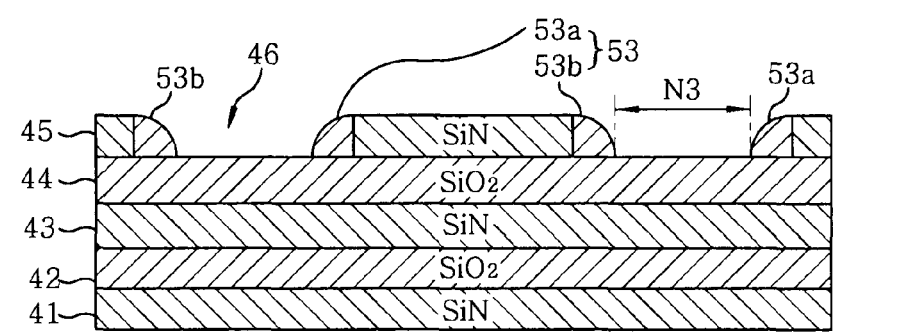

First, as in the first embodiment, a film forming process by thermal CVD is performed, and an amorphous silicon film 51 is formed, with such a thickness to form a recess 52, over the entire surface of the wafer W including the side surfaces of the mask patterns 46 (FIG. 4B). Next, the amorphous silicon film 51 is anisotropically plasma etched so that downwardly widening deposits (sidewalls) 53a and 53b remain on the sidewalls of the SiN film 45. The etching is stopped when the following conditions are met: (1) the top surface of the SiN film 45 is exposed between the deposits 53a and 53b forming a pair 53 at both sides of a mask portion in the SiN film 45; and (2) the SiO₂ film 44 is exposed between the pair 53 (FIG. 4C). An opening width N3 between a deposit 53a in a pair 53 and a deposit 53b in an adjacent pair 53 is, e.g., 48 nm.

Figure 4D:
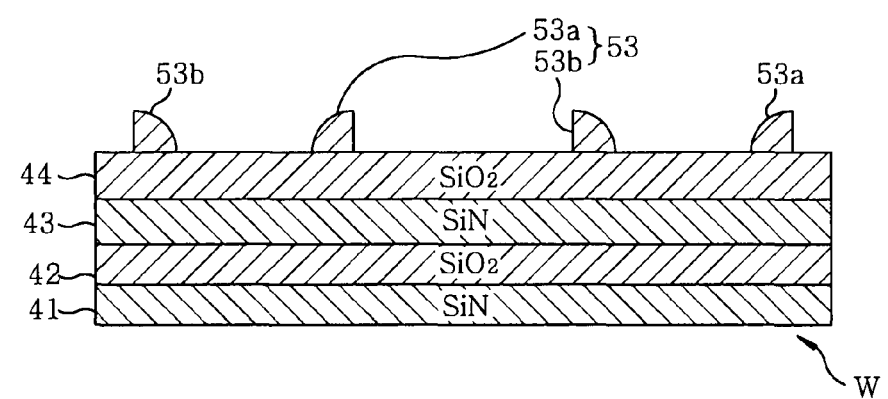
Figure 5A:
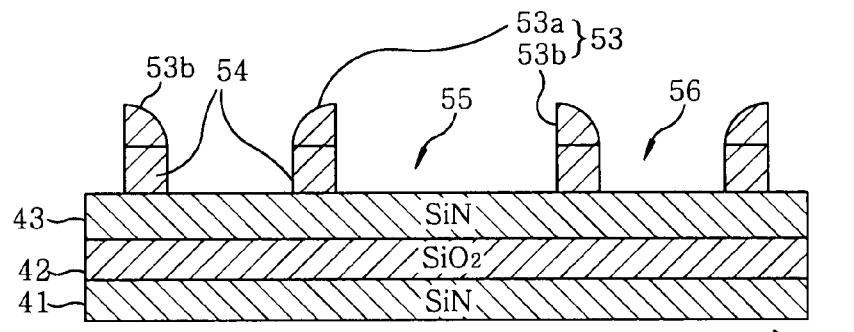
FIGS. 5A to 5D further show the process for manufacturing the semiconductor device in accordance with the second embodiment of the present invention.

Next, the SiN film 45 is removed by plasma etching (FIG. 4D), and the SiO₂ film 44 is anisotropically etched down by the plasma while masked by the deposits 53a and 53b. Accordingly, the mask patterns 55 and 56 defined by mask portions 54 corresponding to the deposits 53a and 53b are formed (FIG. 5A). Each mask pattern 55 is formed between deposits 53a and 53b forming a pair 53, and each mask pattern 56 is formed between a deposit 53a in a pair 53 and a deposit 53b in an adjacent pair 53.

Figure 5B:
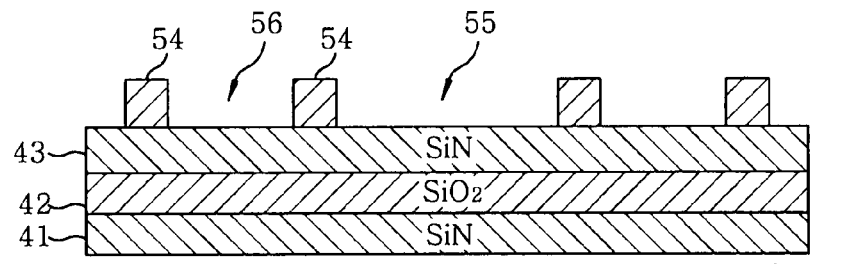
Figure 5C:
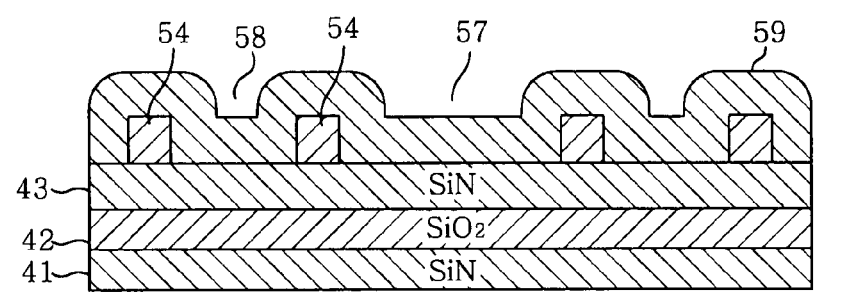

Thereafter, the deposits 53a and 53b are removed by plasma etching (FIG. 5B), and an amorphous silicon film 59 is formed over the surface of the wafer W with such a thickness to form recesses 57 and 58 corresponding to the mask patterns 55 and 56 (FIG. 5c).

Figure 5D:
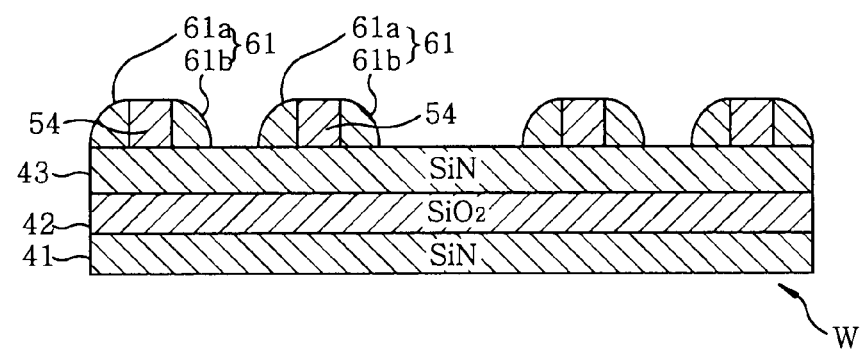

Then, the amorphous silicon film 59 is anisotropically etched down by plasma. The etching is stopped when the following conditions are met: (1) the top surface of each mask portion 54 in the SiO₂ film 44 is exposed; (2) downwardly widening deposits (sidewalls) 61a and 61b forming a pair 61 are remaining at the sidewalls of the mask portion 54; and (3) the SiN film 43 is exposed between two adjacent pairs 61 (FIG. 5D).

Figure 6A:
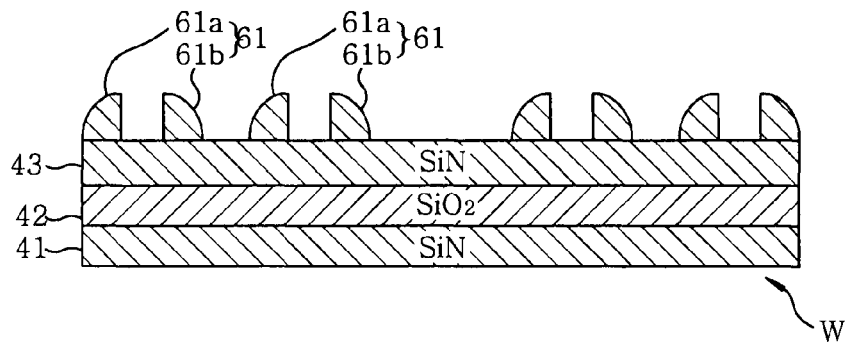
FIGS. 6A to 6D further show the process for manufacturing the semiconductor device in accordance with the second embodiment of the present invention.
Figure 6B:
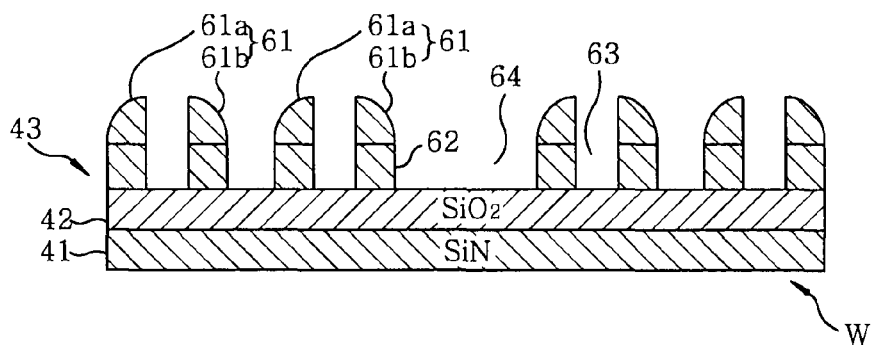
Figure 6C:
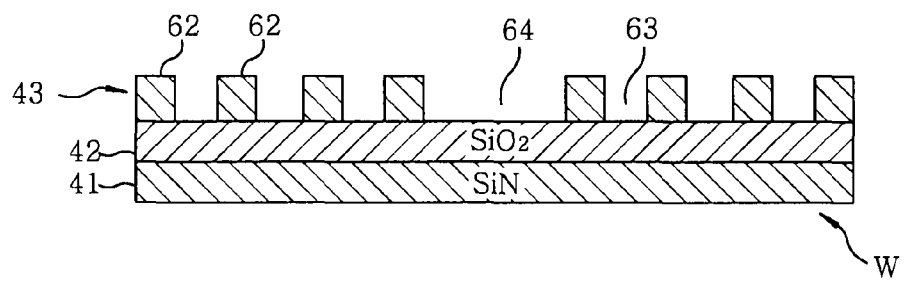

Next, each mask portion 54 formed in the SiO₂ film 44 is removed by plasma etching (FIG. 6A). Then, the SiN film 43 is anisotropically etched down by plasma while masked by the deposits 61a and 61b, thereby forming in the SiN film 43 mask patterns defined by the mask portions 62 (FIG. 6B). The reference numeral 64 designates mask patterns each of which is formed between two adjacent mask portions 62 facing each other via a region located at the widthwise center of a mask portion having existed in the SiN film 45. Further, the reference numeral 63 designates mask patterns formed between two adjacent mask portions 62. The width of each mask pattern 64 is greater than that of each mask pattern 63. Upon completing the formation of the mask patterns 63 and 64, the deposits 61a and 61b are removed by plasma etching (FIG. 6C).

Figure 6D:
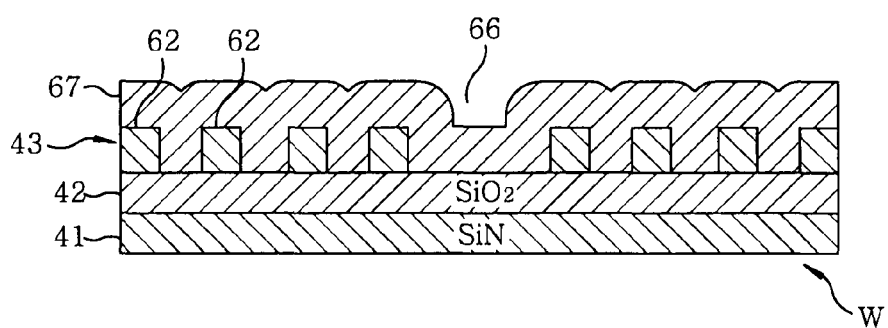
Figure 7A:
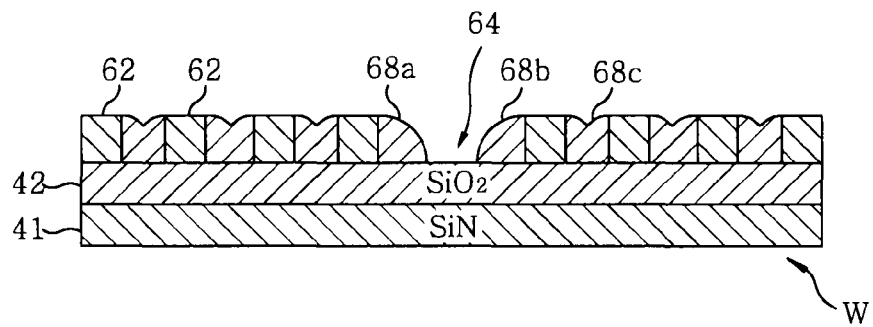
FIGS. 7A to 7D further show the process for manufacturing the semiconductor device in accordance with the second embodiment of the present invention.

Then, the amorphous silicon film 67 is formed over the surface of the wafer W with such a thickness to form a recess 66 corresponding to each mask pattern 64 (FIG. 6D). Thereafter, the amorphous silicon film 67 is anisotropically etched down by plasma. The etching is stopped when the following conditions are met: (1) the top surface of the mask portion 62 formed in the SiN film 43 is exposed; (2) downwardly widening deposits (sidewalls) 68a and 68b of the amorphous silicon film 67 are remaining at the sidewalls of the mask portions 62 that define the mask patterns 64; (3) the SiO₂ film 42 is exposed between the deposits 68a and 68b; and (4) the deposits 68c of the amorphous silicon film 67 are remaining between adjacent mask portions 62 that define the mask patterns 63 (FIG. 7A).

Figure 7B:
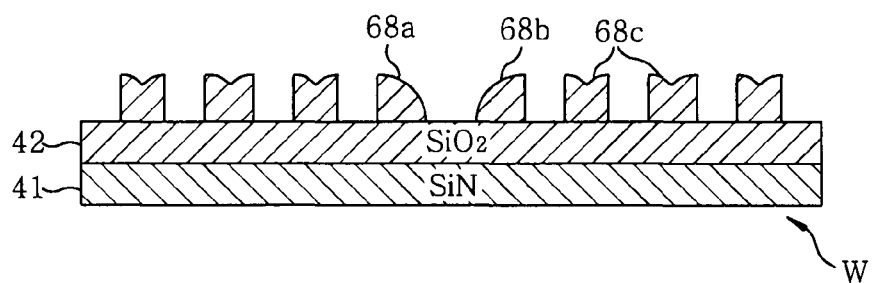
Figure 7C:
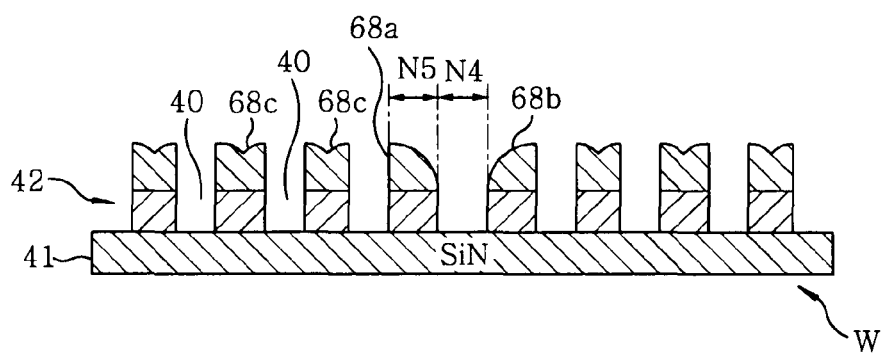
Figure 7D:
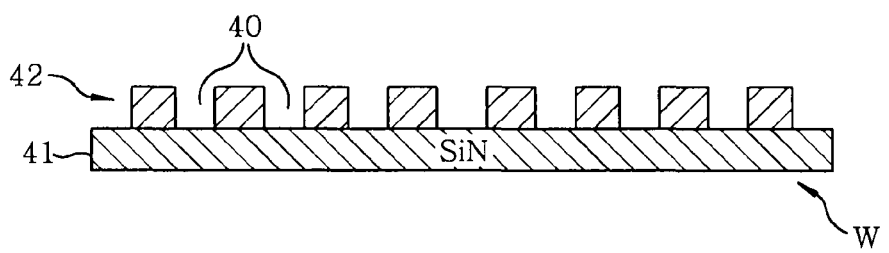

Next, the mask portions 62 are removed by plasma etching (FIG. 7B), and the SiO₂ film 42 is anisotropically etched down by plasma while masked by the deposits 68a, 68b and 68c. Accordingly, patterns 40 are formed in the SiO₂ film 42 (FIG. 7C). Then, the deposits 68a, 68b and 68c are removed by plasma etching (FIG. 7D). As described above, a width N4 of each pattern 40 and a width N5 between two adjacent patterns 40 are substantially the same, i.e., 16 nm, which is about ⅕ of the width N1 of each mask pattern 46 in the SiN film 45.

In the second embodiment as well, a pattern 40 whose line width is finer than that of a pattern 46 originally formed in the SiN film 45 can be formed in the SiO₂ film 42 without trimming. Therefore, by using the patterns 40, a semiconductor device having a fine wiring can be manufactured. Further, the width of a pattern 40 and the width between two adjacent patterns 40 are the same, so that the present invention is especially suitable for manufacturing a semiconductor device such as a NAND type flash memory or the like as in the first embodiment.

Third Embodiment

Figure 8A:
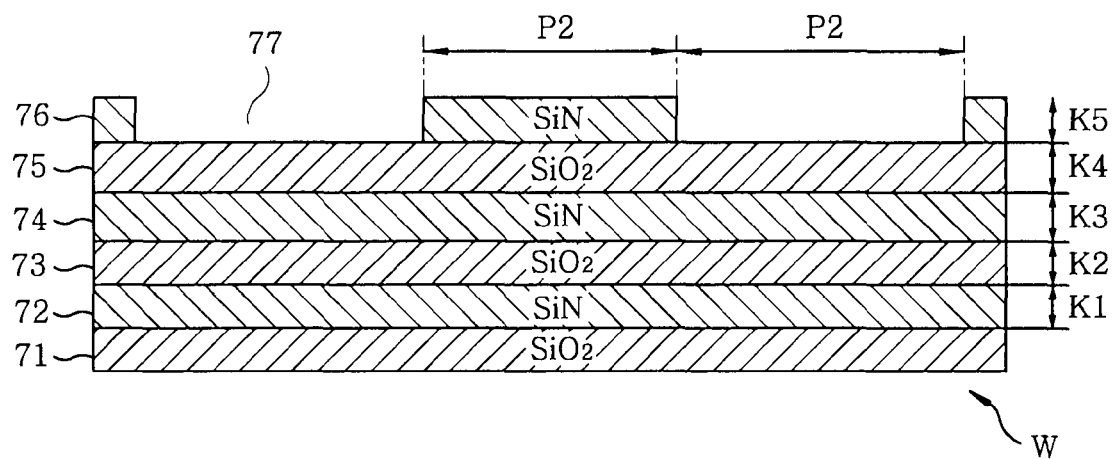
FIGS. 8A to 8D show a process for manufacturing a semiconductor device in accordance with a third embodiment of the present invention.

Hereinafter, the third embodiment of the present invention will be described. Referring to FIG. 8A, in the third embodiment, an SiN film 76, an SiO₂ film 75, an SiN film 74, an SiO₂ film 73, an SiN film 72 and an SiO₂ film 71 are formed over a surface of a wafer W in that order from the top. Mask patterns 77 equivalent to the mask patterns 25 in the SiN film 24 are formed in the SiN film 76.

In this example, the mask patterns 77 are formed at regular intervals. A width P1 of each mask pattern 77 is, e.g., 80 nm, and a width P2 between two adjacent mask patterns 77 is, e.g., 80 nm. The ratio between P1 and P2 is 1:1. Moreover, the thicknesses of the SiN film 72, the SiO₂ film 73, the SiN film 74, the SiO₂ film 75 and the SiN film 76 which are denoted by K1, K2, K3, K4 and K5, respectively, are, e.g., 11 nm, 11 nm, 11 nm and 11 nm, respectively.

In the third embodiment, the dimensions of the mask patterns 77 and the films 72 to 76 are set as above, and the formation of sidewalls and the plasma etching by using the sidewalls as the mask are repetitively performed as in the first embodiment. Thus, a plurality of patterns corresponding to the mask patterns 77 are formed in the SiN film 72. The width of each pattern in the SiN film 72 is about ⅐ of that of each mask patterns 77, and the ratio between the width of each pattern in the SiN film 72 and the gap between two adjacent patterns in the SiN film 72 is substantially 1:1. Therefore, the number of patterns formed in the SiN film 72 is seven times the number of the patterns formed in the SiN film 76 (septupling the number of patterns). The processing gases used for plasma etching the films and those used for forming an amorphous silicon film are the same as those used in the first embodiment.

Figure 8B:
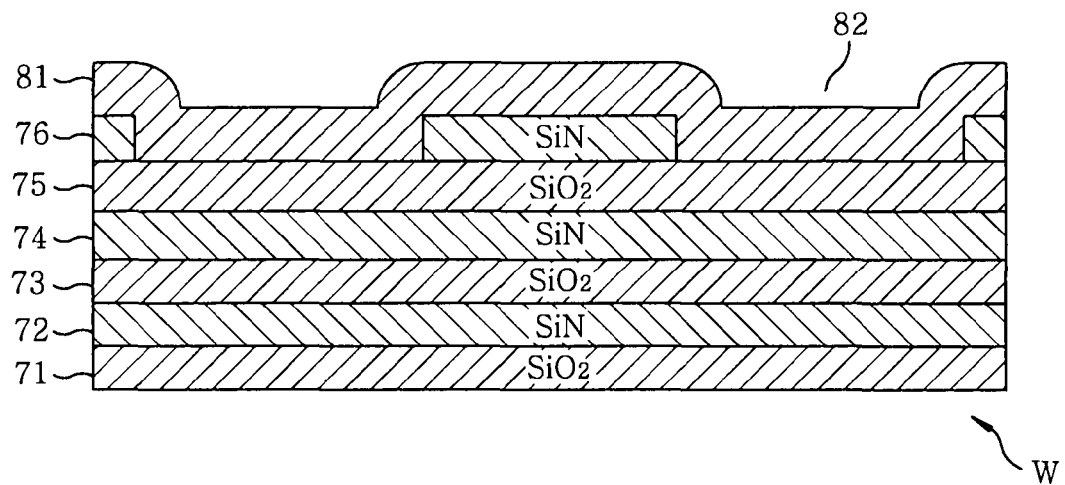
Figure 8C:
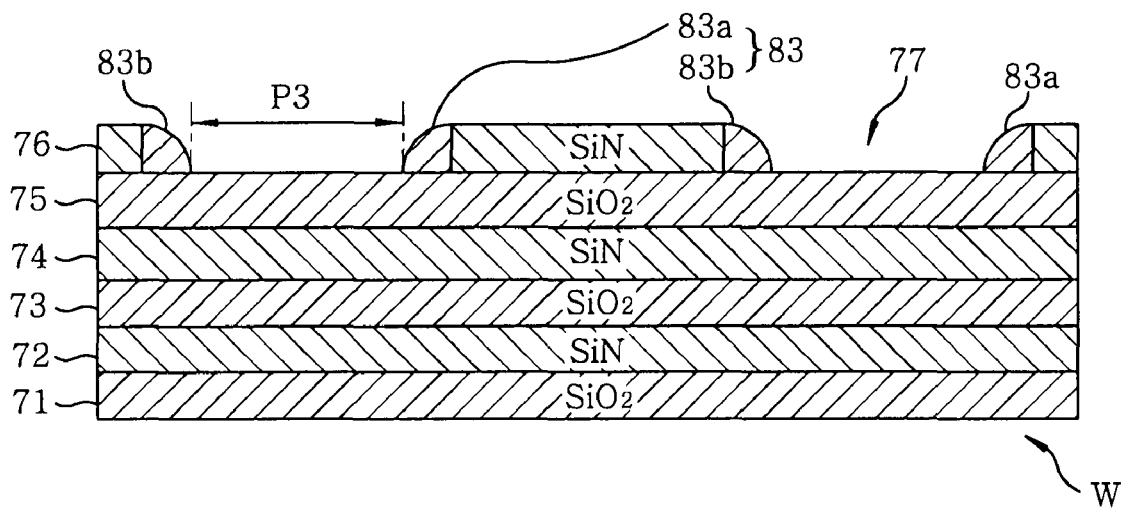

First, an amorphous silicon film 81 is formed, with such a thickness to form a recess 82, over the entire surface of the wafer W including the side surfaces of the mask patterns 77 (FIG. 8B). Next, the amorphous silicon film 81 is anisotropically etched by plasma so that downwardly widening deposits (sidewalls) 83a and 83b formed from the amorphous silicon film 81 remain at the sidewalls of the SiN film 76. The etching is stopped when the following conditions are met: (1) the top surface of the SiN film 76 is exposed between the deposits 83a and 83b forming a pair 83 formed at both sides of a mask portion of the SiN film 76; and (2) the top surface of the SiO₂ film 75 is exposed between two adjacent pairs 83 (FIG. 8C). At this time, an opening width P3 between a deposit 83a in a pair 83 and a deposit 83b in an adjacent pair 83 is, e.g., 57 nm.

Figure 8D:
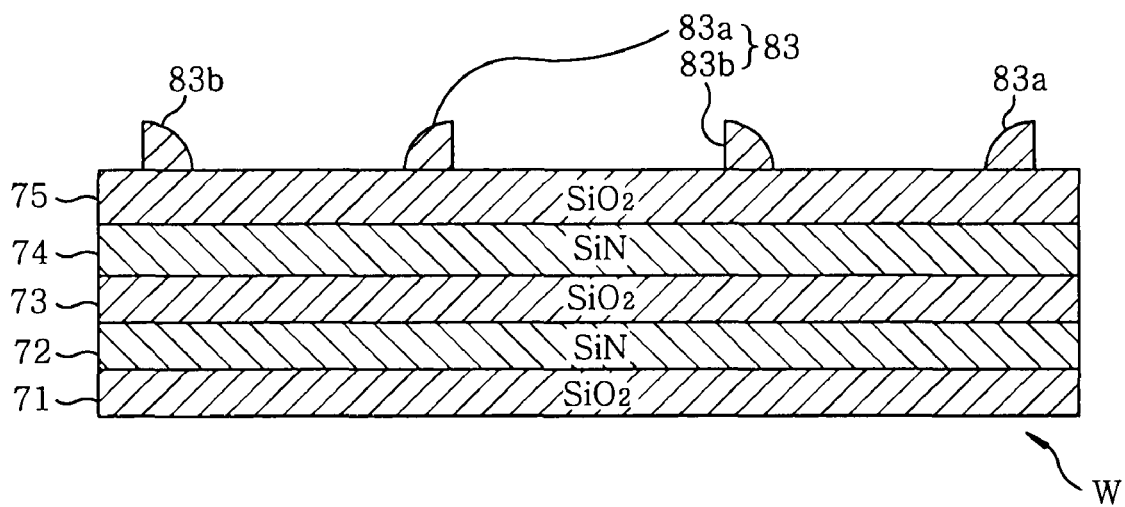
Figure 9A:
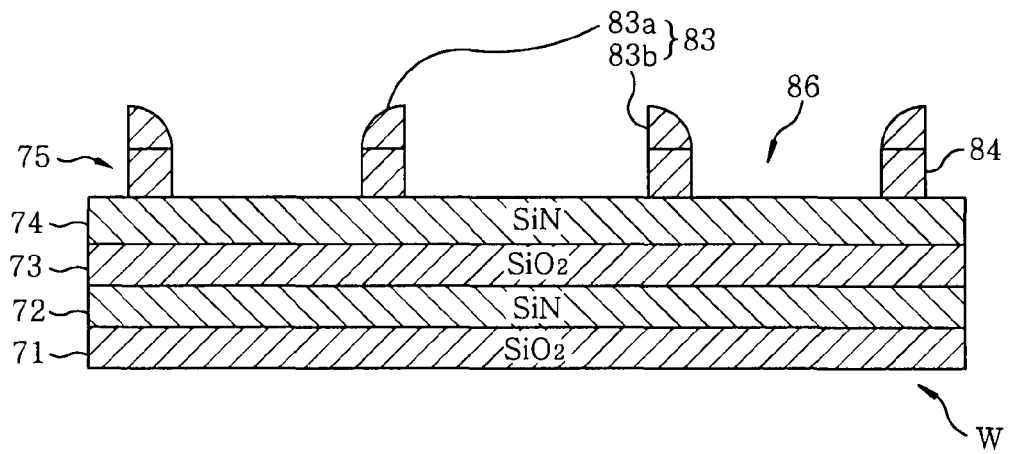
FIGS. 9A to 9E further show the process for manufacturing the semiconductor device in accordance with the third embodiment of the present invention.

Next, the SiN film 76 is removed by plasma etching (FIG. 8D), and the SiO₂ film 75 is anisotropically etched down by plasma while masked by the deposits 83a and 83b. As a consequence, mask portions 84 that define the mask patterns 85 corresponding to the deposits 83a and 83b are formed (FIG. 9A). The width of each mask pattern 85 is larger than that of each mask pattern 86.

Figure 9B:
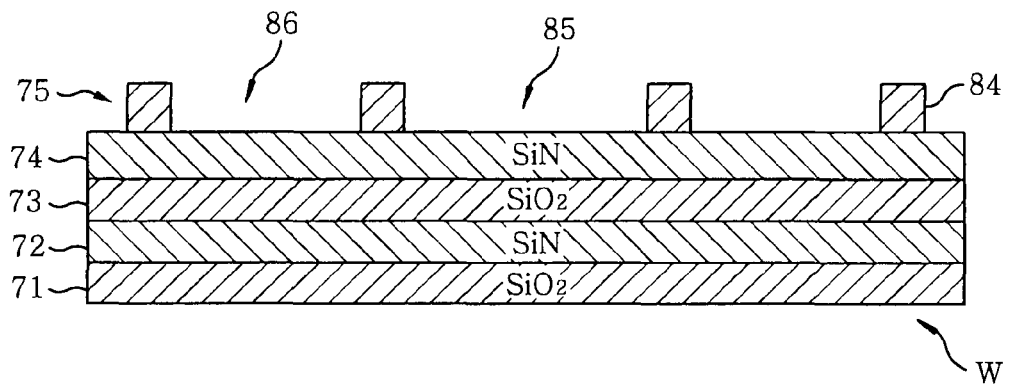
Figure 9C:
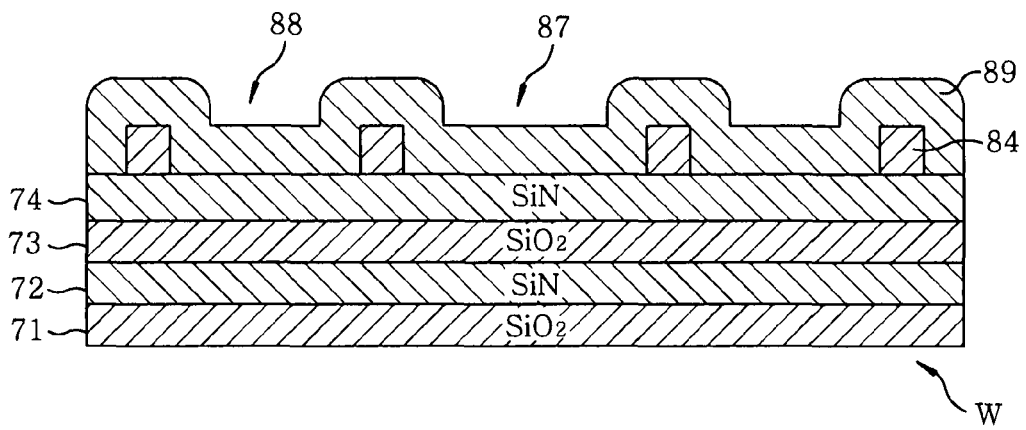

Thereafter, the deposits 83a and 83b are removed by plasma etching (FIG. 9B), and an amorphous silicon film 89 is formed over the surface of the wafer W with such a thickness to form recesses 87 and 88 corresponding to the mask patterns 85 and 86, respectively (FIG. 9C).

Figure 9D:
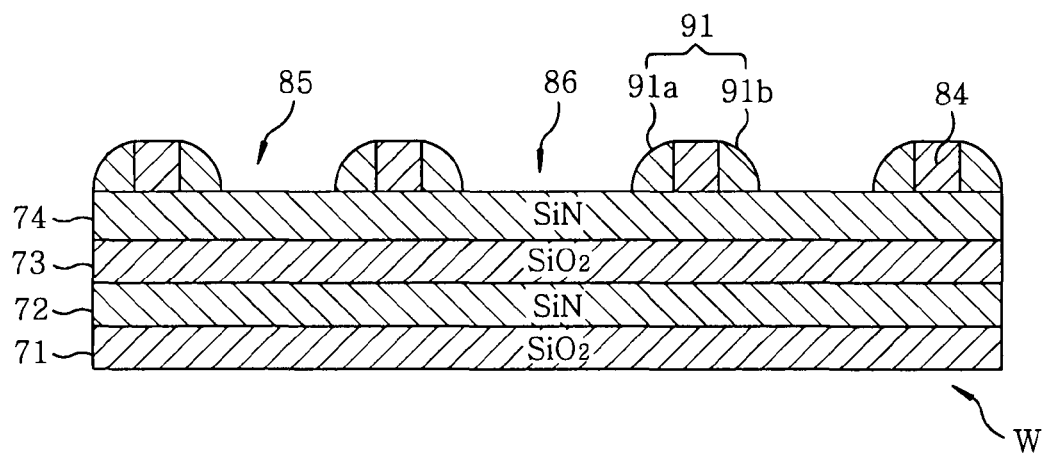

Then, the amorphous silicon film 89 is anisotropically etched down by plasma. The etching is stopped when the following conditions are met: (1) the top surface of the mask portion 84 formed from the SiO₂ film 75 is exposed; (2) downwardly widening deposits (sidewalls) 91a and 91b forming a pair 91 remain at the sidewalls of each mask portion 84; and (3) the SiN film 74 is exposed between the deposits 91a and 91b (FIG. 9D).

Figure 9E:
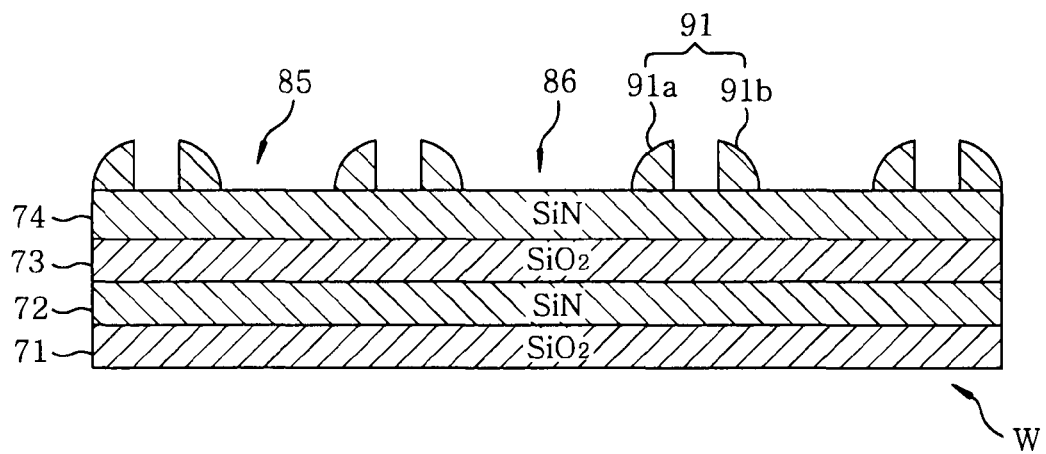
Figure 10A:
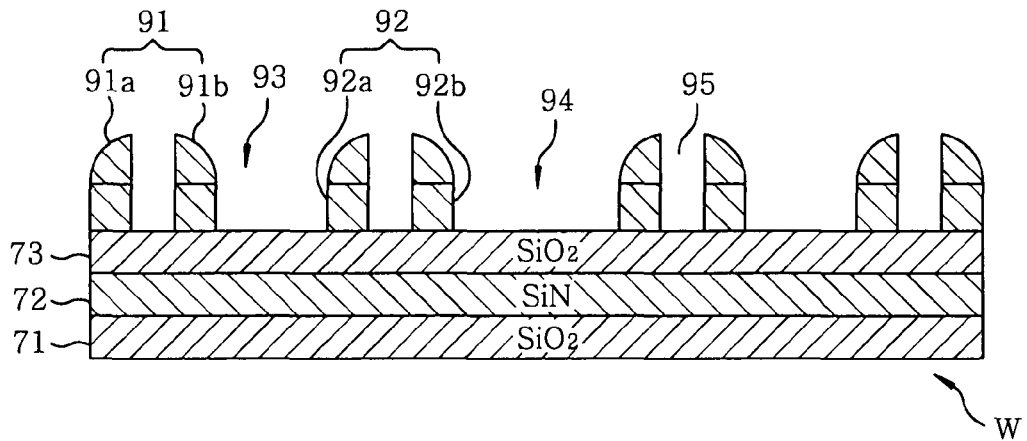
FIGS. 10A to 10F further show the process for manufacturing the semiconductor device in accordance with the third embodiment of the present invention.

Next, the mask portions 84 formed from the SiO₂ film 75 is removed by plasma etching (FIG. 9E). Then, the SiN film 74 is anisotropically etched down by plasma while masked by the deposits 91a and 91b. When mask portions 92a and 92b that constitute a pair 92 corresponding to the deposits 91a and 91b are formed (FIG. 10A), the etching is stopped. Reference numerals 93 and 94 indicate mask patterns having different widths which are formed between the pairs 92. The pattern 94 has a larger width. Further, a reference numeral 95 indicates patterns each of which is formed between the mask portions 92a and 92b that constitute a pair 92.

Figure 10B:
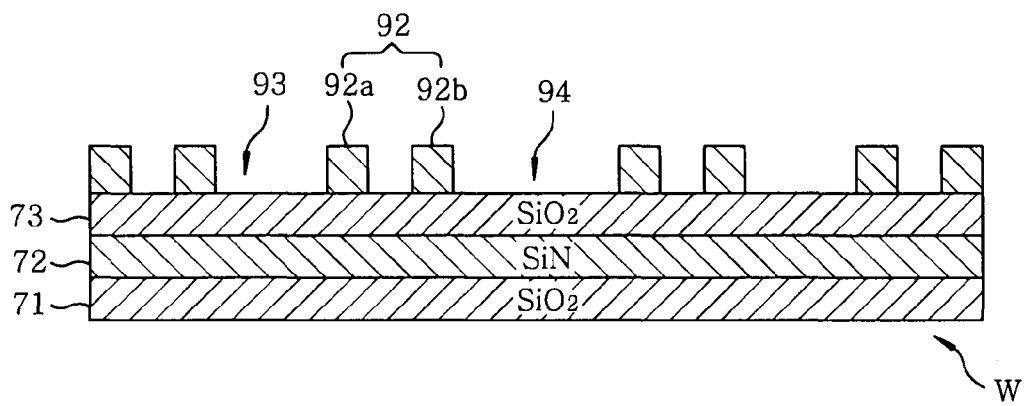
Figure 10C:
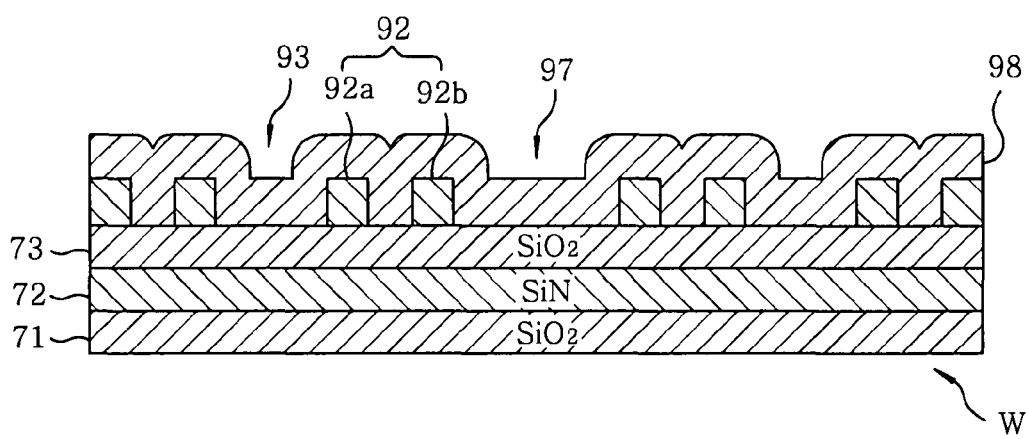
Figure 10D:
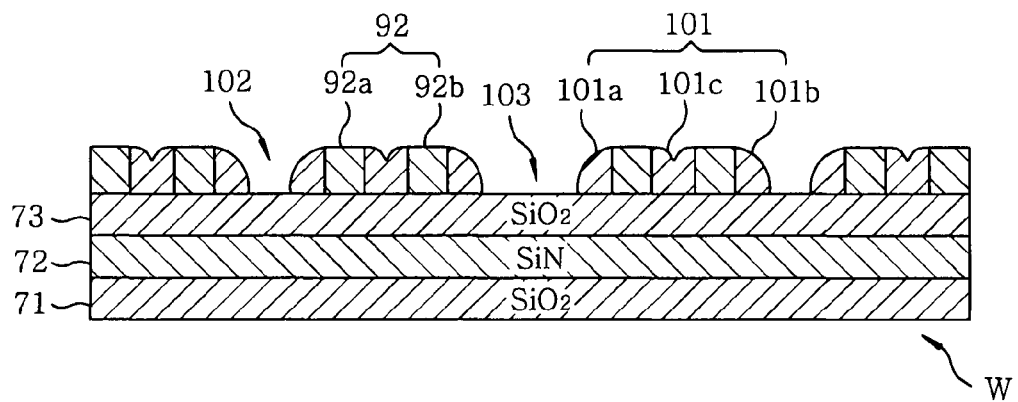

After the deposits 91a and 91b are removed by plasma etching (FIG. 10B), an amorphous silicon film 98 is formed by thermal CVD over the surface of the wafer W with such a thickness to form recesses 96 and 97 corresponding to the mask patterns 93 and 94, respectively (FIG. 10D). Thereafter, the amorphous silicon film 98 is anisotropically etched down by plasma. The etching is stopped when the following conditions are met: (1) the top surface of the mask portions 92a and 92b formed from the SiN film 74 is exposed; (2) deposits 101c of the amorphous silicon film 98 remain such that each deposit 101c is located between the mask portions 92a and 92b that constitute a pair 92; and (3) the SiO₂ film 73 is exposed between deposits 101a and 101b formed in adjacent pairs 92; and (3) the downwardly widening deposits 101a and 101b that constitute a pair remain at the outer sidewalls of the mask portions 92a and 92b of the pair 92.

At this time, the deposits 101a to 101c formed at the sidewalls of the pair 92 are regarded as a group 101, and the group 101 is arranged in a manner corresponding to the arrangement of the mask portions 92a and 92b. Further, every other gap between the groups 101 is equal in size. Reference numerals 102 and 103 represent openings having different widths, which are formed between the groups 101. The width of the opening 103 is larger than that of the opening 102.

Figure 10E:
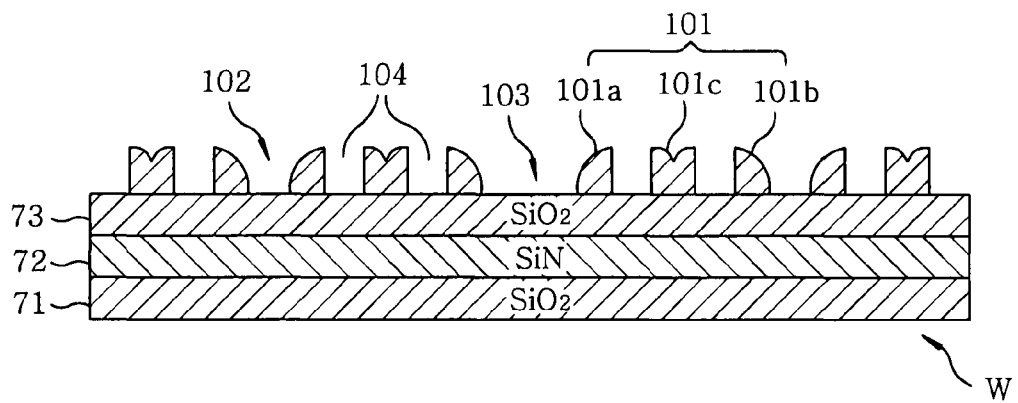
Figure 10F:
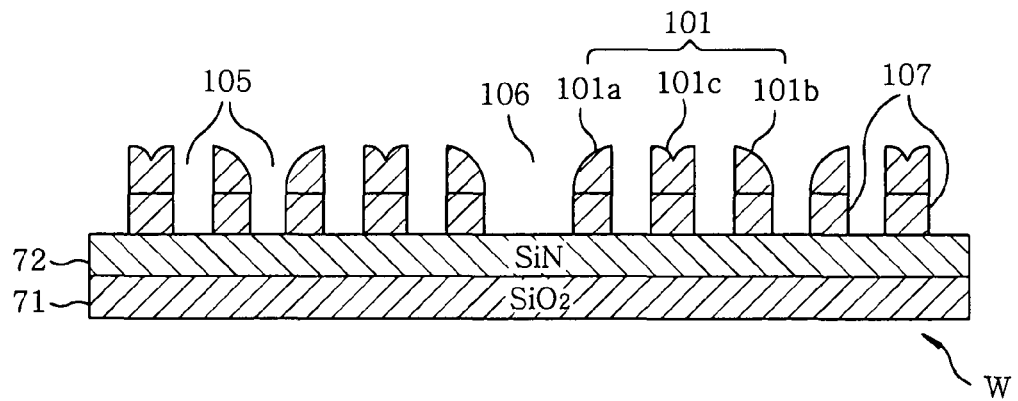

Next, the mask portions 92a and 92b formed from the SiN film 74 is removed by plasma etching, and openings 104 whose opening width is same as that of each opening 102 are formed between the deposits 101a to 101c forming the same group 101 (FIG. 10E). Then, the SiO₂ film 73 is anisotropically etched down by plasma while masked by the deposits 101a to 101c, thus forming in the SiO₂ film 73 mask portions 107 that define mask patterns of different widths. In FIG. 10F, a reference numeral 105 indicates mask patterns corresponding to the openings 102 and 104, and a reference numeral 106 represents mask patterns corresponding to the openings 103. Each mask pattern 106 is defined by the mask portions 107 facing each other via a region located at the widthwise center of the mask portion having existed in the SiN film 76 (FIG. 10F).

Figure 11A:
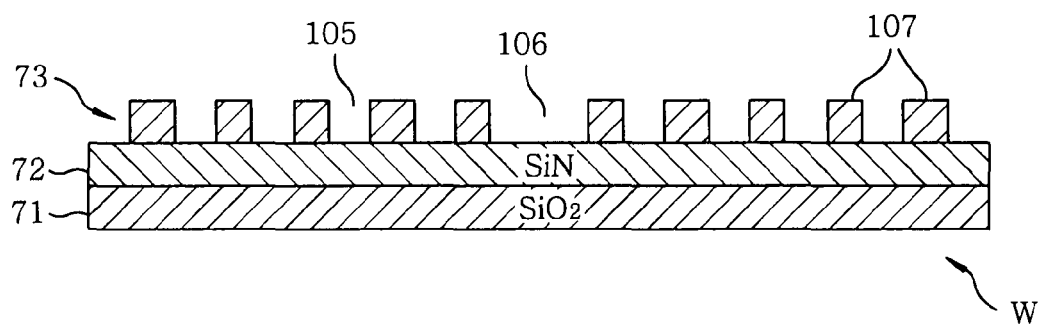
FIGS. 11A to 11F further show the process for manufacturing the semiconductor device in accordance with the third embodiment of the present invention.
Figure 11B:
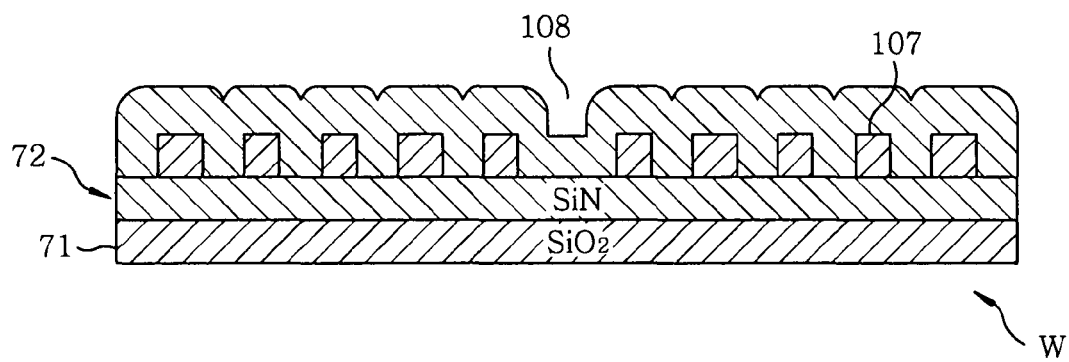
Figure 11C:
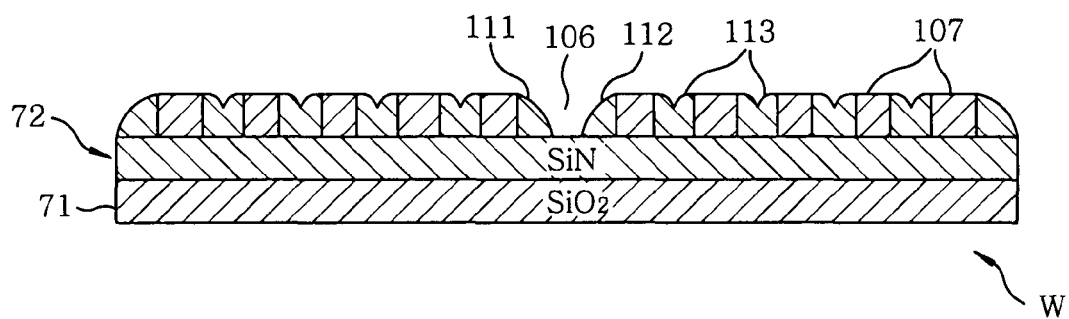

Then, the deposits 101a to 101c are removed by plasma etching (FIG. 11A), and an amorphous silicon film 110 is formed over the surface of the wafer W with such a thickness to form recesses 108 corresponding to the mask patterns 104 (FIG. 11B). Next, the amorphous silicon film 110 is anisotropically etched down by plasma. The etching is stopped when the following conditions are met: (1) the top surfaces of the mask portions 107 formed from the SiO₂ film 73 are exposed; (2) downwardly widening deposits 111 and 112 remain at the sidewalls of the mask portions 107 that define mask patterns 106; (3) the SiN film 72 is exposed between the deposits 101 and 102; and (4) deposits 113 remain between the mask portions 107 that form the mask patterns 105 (FIG. 11C).

Figure 11D:
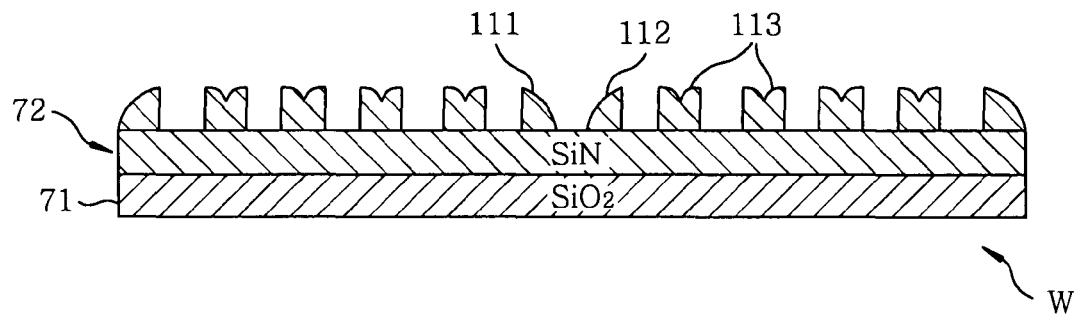
Figure 11E:
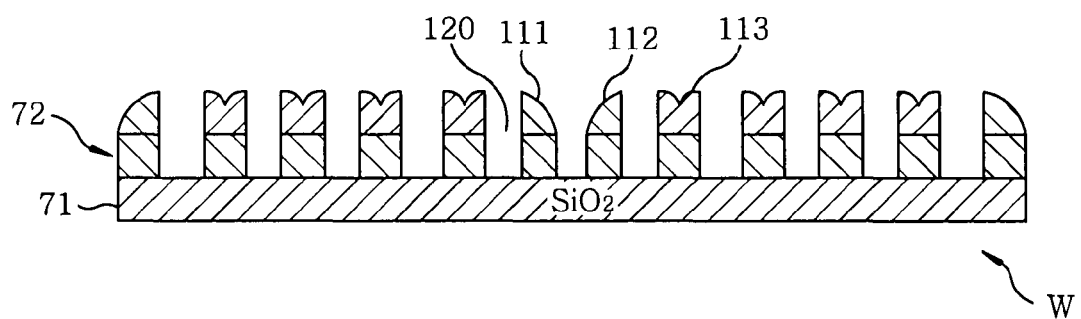
Figure 11F:
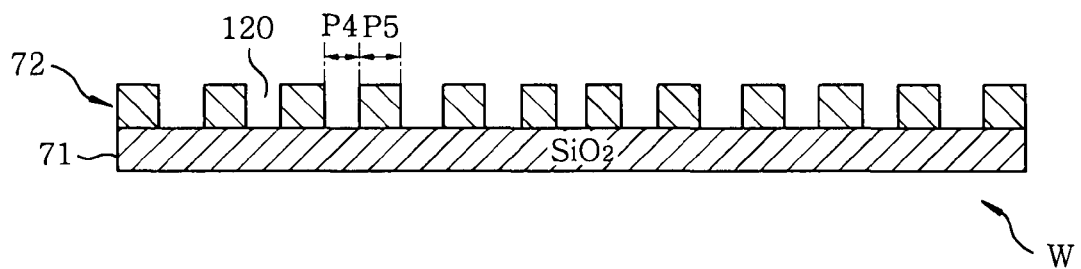

Next, the mask portions 107 are removed by plasma etching (FIG. 11D), and the SiN film 72 is etched while masked by the deposits 111 to 113. Accordingly, patterns 120 are formed in the SiN film 72 (FIG. 11E). Then, the deposits 111 to 113 are removed by plasma etching (FIG. 11F). As described above, the width P4 of each pattern 111 and the width P5 between adjacent patterns 120 are substantially the same, i.e., 11 nm, which is about ⅐ of the width P1 of each mask pattern 77 having existed in the SiN film 76.

In the third embodiment as well, the patterns 120 whose line width is smaller than that of the patterns 77 formed in the SiN film 76 can be formed in the SiN film 72. Therefore, it is possible to manufacture a semiconductor device having a fine wiring by using the patterns 120. Further, the width of each pattern 120 and the width between two adjacent patterns 120 are the same. Therefore, the present invention is especially suitable for manufacturing a semiconductor device such as a NAND type flash memory or the like as in the first embodiment.

In the above embodiments, final patterns are formed in an underlying layer from original patterns formed at regular intervals in an original layer over the wafer W such that the width of each final pattern is about ⅓, ⅕ or ⅐ of that of each original pattern. However, it is also possible to form at regular intervals final patterns whose size is smaller than ⅐ of that of the original patterns (e.g., ⅑, 1/11 or 1/(2n−1) of the size of the original patterns, where n is positive integer greater than 6) by increasing the number of layers while adjusting the dimensions of the layers from the top layer over the wafer W to the target layer where the final patterns are to be formed; repeatedly performing the process in which deposits are formed at the sidewalls of mask portions, and an underlying layer beneath the deposits are etched while masked by the deposits; forming first deposits that fill gaps between adjacent patterns and second deposits existing at the sidewalls of the mask portions that form the patterns; and etching between the mask portions where the underlying layer is exposed.

Further, the films formed over the wafer W is not limited to those described above, and the top layer may be a photoresist film. Also, the method for forming an amorphous silicon film is not limited to a thermal CVD method.

Figure 12:
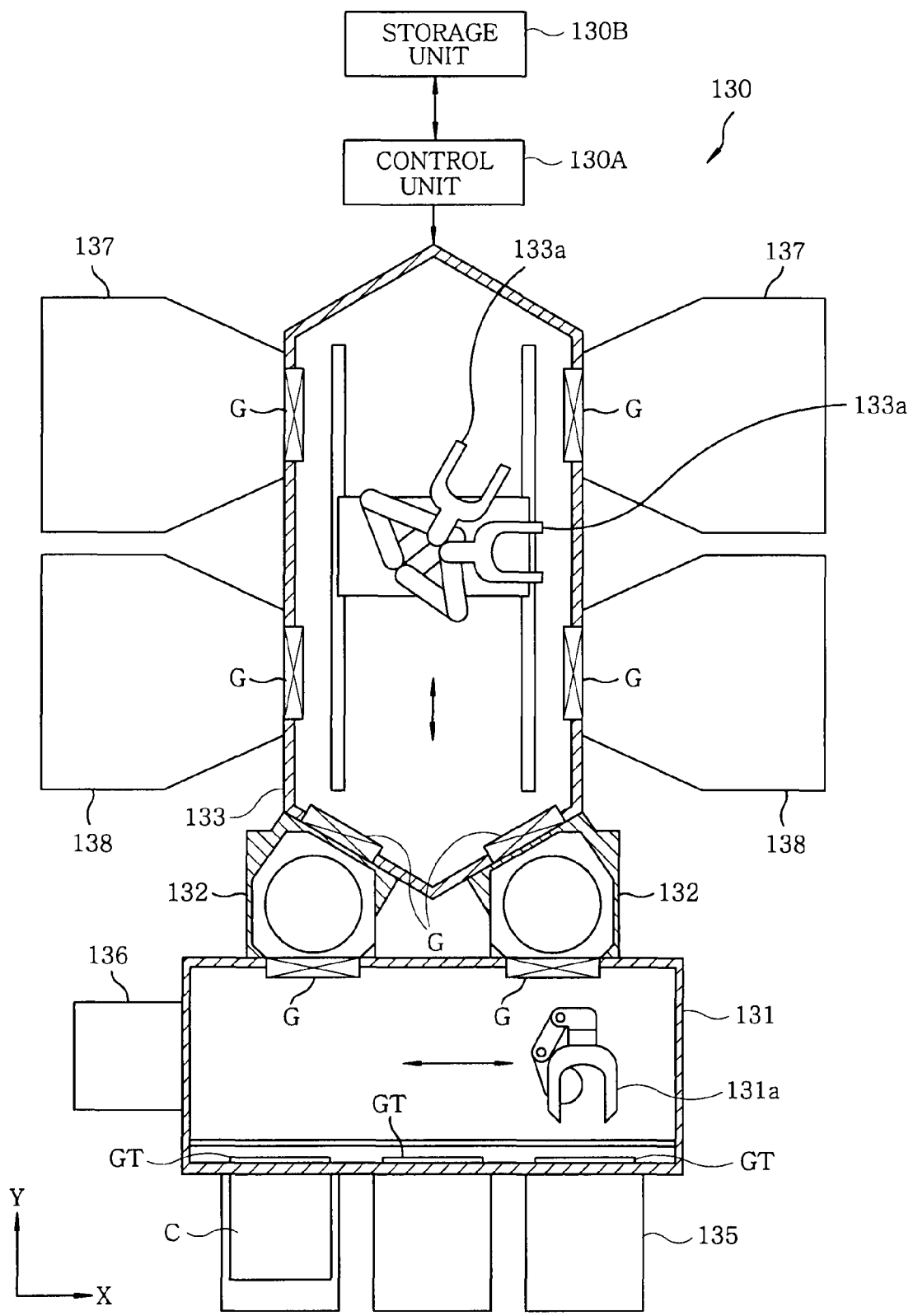
FIG. 12 is a schematic top view of a semiconductor device manufacturing apparatus of the present invention.
Figure 13A:
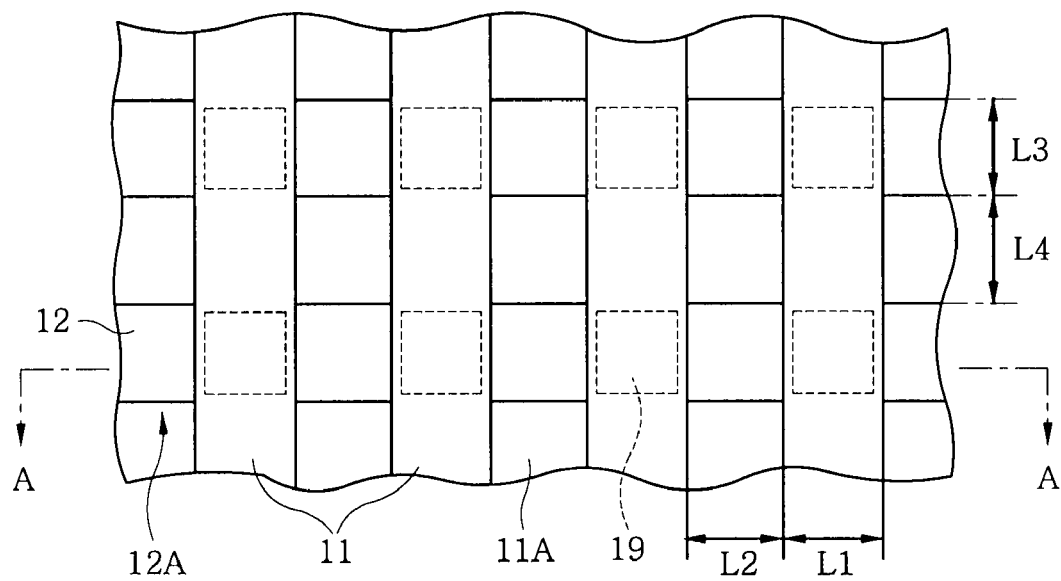
FIGS. 13A and 13B show a film structure of a NAND type flash memory as an example of the semiconductor device manufacturing apparatus.
Figure 13B:
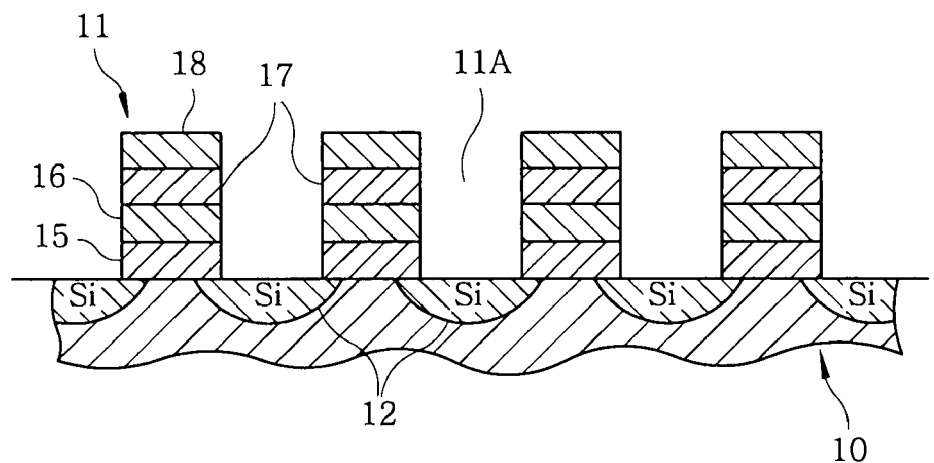
Figure 14A:
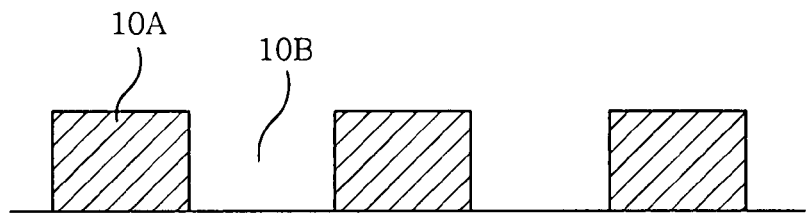
FIGS. 14A to 14C show an example of a mask formed after trimming.
Figure 14B:
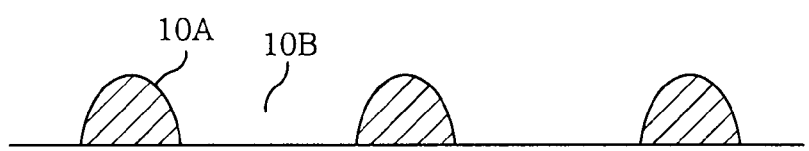
Figure 14C:
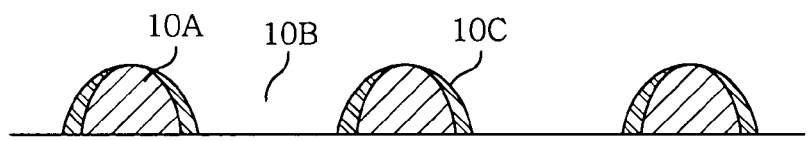

Hereinafter, an exemplary semiconductor device manufacturing apparatus for performing the semiconductor device manufacturing method will be described with reference to FIG. 12. The semiconductor device manufacturing apparatus 130 includes a first transfer chamber 131 as a loader module for loading and unloading the wafer which has a first wafer transfer device 131a; load-lock chambers 132 and 133; and a second transfer chamber 133 as a vacuum transfer chamber module which has a second wafer transfer device 133a. A wafer W is transferred to the semiconductor device manufacturing apparatus 130 while being accommodated in an airtight carrier C having therein a plurality of wafers W. A reference numeral 135 in FIG. 12 indicates a load port on which the carrier C is mounted, and a reference numeral 136 represents an alignment chamber for adjusting the direction of the wafer W or the eccentricity thereof.

The semiconductor device manufacturing apparatus 130 includes CVD film forming modules 137 for performing a film forming process on the wafer W by thermal CVD, a mounting table for mounting thereon the wafer, an electrode provided in parallel to the mounting table, and etching modules 138 for performing a plasma etching process on the wafer W by applying a high frequency to the mounting table and the electrode. These modules 137 and 138 are connected to the second transfer chamber 133. A notation G in the drawing indicates a gate valve (partition valve) for partitioning the load-lock chambers 132 from the first or the second transfer chamber 131 or 133, or the second transfer chamber 133 from each of the processing modules. The gate valve is closed except when the wafer W is transferred.

When the carrier C is mounted on the load port 135, the wafer W in the carrier C is transferred to the load lock chamber 132 via the first transfer chamber 131 by the first wafer transfer unit 131a. Further, the wafer W is received from the load lock chamber 132 by the second wafer transfer unit 133a. The wafer W is transferred between the CVD film forming module 137 and the etching module 138. A process for forming an oxide film is performed by the CVD film forming module 137, and the etching process is performed by the etching module 138. Upon completion of the processes, the wafer W is transferred from the second transfer chamber 133 to the load lock chamber 132 via the second wafer transfer unit 133a, and then is returned to the carrier C via the first transfer chamber 131 by the first wafer transfer unit 131a.

The semiconductor device manufacturing apparatus 130 includes a control unit 130A having, e.g., a computer. The control unit 130A is provided with a program (not shown), a CPU (central processing unit) and a memory. The program is configured to execute commands (steps) for transferring the processing the wafer by sending control signals from the control unit 130A to respective parts of the semiconductor device manufacturing apparatus 130.

Further, the memory has a region which processing parameters of each module such as a processing pressure, a processing temperature, a processing time, a gas flow rate, an electric power and the like are input to. When the CPU executes the respective commands of the program, these processing parameters are read out, and the control signals corresponding to the parameters are transmitted to the respective parts of the semiconductor device manufacturing apparatus 130. The program (including a program related to a screen to which the processing parameters are input) is stored in a storage unit 130B such as a flexible disk, a compact disk, an MO (magneto-optical) disk or the like, and is appropriately installed in the control unit 130A.

While the invention has been shown and described with respect to the embodiments, it will be understood by those skilled in the art that various changes and modification may be made without departing from the scope of the invention as defined in the following claims.

What is claimed is:

1. A pattern forming method for forming parallel linear grooves on a substrate by plasma etching, wherein the substrate has thereon three-layer films including from the top a first-layer film, a second-layer film and a third-layer film by using a substrate in which first mask patterns of linear shape are formed on the first-layer film, the method comprising:

(a) forming pairs of deposits on both sidewalls of each of mask portions in the first mask patterns by forming a thin film on the first mask patterns, performing an anisotropic etching by plasma to leave downwardly widening deposits at the both sidewalls of each of the mask portions, and exposing a top surface of the second-layer film between the deposits;

(b) forming on the second-layer film second mask patterns each formed of a pair of mask portions corresponding to the pair of the deposits by removing the mask portion, plasma etching the second-layer film by using the deposits as a mask, and removing the deposits; and thereafter, (c) forming a thin film on the second mask patterns of the second-layer film, and performing an anisotropic etching by plasma to leave downwardly widening deposits on sidewalls of every two of mask portions facing each other via a region corresponding to a width-directional center of one of the mask portions of the first mask patterns, and to expose a top surface of the third-layer film between the deposits while leaving deposits between adjacent mask portions of two of the second mask patterns; and thereafter, (d) forming grooves on the third-layer film by removing the second mask portion formed on the second-layer film, and etching off the third-layer film by plasma while using the deposits as a mask.

2. The pattern forming method of claim 1, wherein a ratio between a width of each of the grooves formed on the third-layer film and that between two adjacent ones of the grooves is about 1:1.

3. The pattern forming method of claim 2, wherein, in the first mask patterns formed on the first-layer film, a ratio between a width of each of the grooves and that of a mask portion between two adjacent ones of the grooves is about 1:1.

4. A pattern forming method for forming parallel linear grooves on a substrate by plasma etching, wherein the substrate has thereon four-layer films including from the top a first-layer film, a second-layer film, a third-layer film and a fourth-layer film by using a substrate in which first mask patterns of linear shape are formed on the first-layer film, the method comprising:
   (a) forming pairs of deposits on both sidewalls of each of mask portions in the first mask patterns by forming a thin film on the first mask patterns, performing an anisotropic etching by plasma to leave downwardly widening deposits at the both sidewalls of each of the mask portions, and exposing a top surface of the second-layer film between the deposits;
   (b) forming on the second-layer film second mask patterns each formed of a pair of mask portions corresponding to the pair of the deposits by removing the mask portion, plasma etching the second-layer film by using the deposits as a mask, and removing the deposits; and thereafter,
   (c) forming on the third-layer film third mask patterns each formed of a pair of mask portions corresponding to the pair of downwardly widening deposits formed both sidewalls of the mask portions of the second mask patterns by sequentially performing processes equivalent to the steps (a) and (b) using the second mask patterns of the second-layer film; and thereafter,
   (d) forming a thin film on the third mask patterns of the third-layer film, and performing an anisotropic etching by plasma to leave downwardly widening deposits on sidewalls of every two of mask portions facing each other via a region corresponding to a width-directional center of one of the mask portions of the first mask patterns, and to expose a top surface of the fourth-layer film between the deposits while leaving deposits between adjacent mask portions of two of the second mask patterns; and thereafter,
   (e) forming grooves on the fourth-layer film by removing the third mask portion formed on the third-layer film, and etching off the fourth-layer film by plasma while using the deposits as a mask.

5. The pattern forming method of claim 4, wherein a ratio between a width of each of the grooves formed on the fourth-layer film and that between two adjacent ones of the grooves is about 1:1.

6. The pattern forming method of claim 5, wherein, in the first mask patterns formed on the first-layer film, a ratio between a width of each of the grooves and that of a mask portion between two adjacent ones of the grooves is about 1:1.

7. A pattern forming method for forming parallel linear grooves on a substrate by plasma etching, wherein the substrate has thereon nth-layer films (n being an integer greater than 4) including from the top a first-layer film to a nth-layer film by using a substrate in which first mask patterns of linear shape are formed on the first-layer film, the method comprising:
   (a) forming pairs of deposits on both sidewalls of each of mask portions in the first mask patterns by forming a thin film on the first mask patterns, performing an anisotropic etching by plasma to leave downwardly widening deposits at the both sidewalls of each of the mask portions, and exposing a top surface of the second-layer film between the deposits;
   (b) forming on the second-layer film second mask patterns each formed of a pair of mask portions corresponding to the pair of the deposits by removing the mask portion, plasma etching the second-layer film by using the deposits as a mask, and removing the deposits; and thereafter,
   (c) forming on the third-layer film third mask patterns each formed of a pair of mask portions corresponding to the pair of downwardly widening deposits formed both sidewalls of the mask portions of the second mask patterns by sequentially performing processes equivalent to the steps (a) and (b) using the second mask patterns of the second-layer film;
   (d) forming on the (n−1)th-layer film (n−1)th mask patterns each formed of a pair of mask portions corresponding to the pair of downwardly widening deposits formed both sidewalls of the mask portions of (n−2)th mask patterns by performing a process equivalent to the step (c) with respect to the third-layer film to the (n−1)th-layer film; and thereafter,
   (e) forming a thin film on the (n−1)th mask patterns of the third-layer film, and performing an anisotropic etching by plasma to leave downwardly widening deposits on sidewalls of every two of mask portions facing each other via a region corresponding to a width-directional center of one of the mask portions of the first mask patterns, and to expose a top surface of the nth-layer film between the deposits while leaving deposits between adjacent mask portions of two of the second mask patterns; and thereafter,
   (f) forming grooves on the n-layer film by removing the (n−1)th mask portion formed on the (n−1)th-layer film, and etching off the nth-layer film by plasma while using the deposits as a mask.

8. The pattern forming method of claim 7, wherein a ratio between a width of each of the grooves formed on the nth-layer film and that between two adjacent ones of the grooves is about 1:1.

9. The pattern forming method of claim 8, wherein, in the first mask patterns formed on the first-layer film, a ratio between a width of each of the grooves and that of a mask portion between two adjacent ones of the grooves is about 1:1.

* * * * *